United States Patent
Sandhu et al.

(10) Patent No.: US 10,748,594 B2
(45) Date of Patent: Aug. 18, 2020

(54) ENABLING FAST PULSE OPERATION

(71) Applicant: Micron Technology, Inc., Boise, ID (US)

(72) Inventors: Gurtej S. Sandhu, Boise, ID (US); Wayne I. Kinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 15/895,671

(22) Filed: Feb. 13, 2018

(65) Prior Publication Data
US 2019/0252015 A1 Aug. 15, 2019

(51) Int. Cl.
*G11C 11/16* (2006.01)
*G11C 16/32* (2006.01)
*G11C 11/14* (2006.01)

(52) U.S. Cl.
CPC ...... *G11C 11/1673* (2013.01); *G11C 11/1659* (2013.01); *G11C 11/1675* (2013.01); *G11C 11/1693* (2013.01); *G11C 16/32* (2013.01); *G11C 11/14* (2013.01)

(58) Field of Classification Search
CPC .. G11C 11/1673; G11C 11/1675; G11C 11/14
See application file for complete search history.

(56) References Cited

U.S. PATENT DOCUMENTS

| | | | |
|---|---|---|---|
| 9,047,944 B2 | 6/2015 | Bedeschi et al. | |
| 9,728,251 B2 | 8/2017 | Bedeschi | |
| 2005/0030787 A1* | 2/2005 | Lowrey | G11C 13/0004 365/163 |
| 2014/0085969 A1* | 3/2014 | Saida | G11C 11/1675 365/158 |
| 2018/0012652 A1* | 1/2018 | Yang | G11C 13/003 |
| 2018/0075891 A1* | 3/2018 | Yang | G11C 11/1673 |

* cited by examiner

*Primary Examiner* — Mohammed A Bashar
(74) *Attorney, Agent, or Firm* — Holland & Hart LLP

(57) ABSTRACT

Methods, systems, and devices for enabling fast pulse operation are described. A threshold voltage of a selection component and a requisite duration for a voltage applied to a selection component to reach a threshold voltage in response to a voltage generated by an external source may be determined. The threshold voltage may correspond to a voltage at which the selection component is configured to release electric charge. A voltage may then be generated and applied to an access line that is in electronic communication with the selection component and a memory cell for at least the requisite duration. Electric charge may be stored at the selection component during the requisite duration and transferred to memory cell after the requisite duration.

31 Claims, 10 Drawing Sheets

ENABLING FAST PULSE OPERATION

BACKGROUND

The following relates generally to memory devices and more specifically to switching of magnetoresistive random access memory (MRAM) devices using fast pulse operation.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, MRAM, spin-transfer torque (STT)-random access memory (RAM) (STT-RAM), dynamic RAM (DRAM), synchronous dynamic RAM (SDRAM), ferroelectric RAM (FeRAM), resistive RAM (RRAM), read only memory (ROM), flash memory, phase change memory (PCM), and others. Memory devices may be volatile or non-volatile. Non-volatile memory (e.g., MRAM, STT-RAM, and PCM) may maintain stored logic states for extended periods of time even in the absence of an external power source. Volatile memory devices (e.g., DRAM) may lose stored logic states over time unless they are periodically refreshed by an external power source. Improving memory devices may include increasing memory cell density, increasing read/write speeds, increasing reliability, increasing data retention, reducing power consumption, or reducing manufacturing costs, among other metrics.

Memory devices may access memory cells in a memory array via conductive paths that may be referred to as access lines. In some cases (e.g., in high density memory arrays), the access lines are constructed using narrow trace widths and placed close to one another to maximize the memory cell density of a memory array. Narrow trace widths may be associated with a higher inherent resistance of the access lines and the close line placement may be associated with a higher inherent capacitance between the access lines. Moreover, the access lines may extend from the periphery of the memory array to the center of a memory array to reach all of the memory cells in an effort to avoid partitioning the memory array into subarrays. As the length of the access lines increase, the inherent resistance of the access lines and the inherent capacitance between the access lines also increases.

Thus, the farther away a memory cell is located from a voltage or current source, the more the memory cell will potentially be affected by these parasitic elements during access operations. For example, a voltage generated by a voltage source located at a periphery of a memory array may be significantly more degraded by the time it reaches memory cells in the center of the memory array relative to memory cells located at the periphery of the memory array—e.g., a rise time of the applied voltage may be slowed, or a magnitude of the voltage may be attenuated, or both.

BRIEF DESCRIPTION OF THE DRAWINGS

The disclosure herein refers to and includes the following figures.

DETAILED DESCRIPTION

Figure 1:
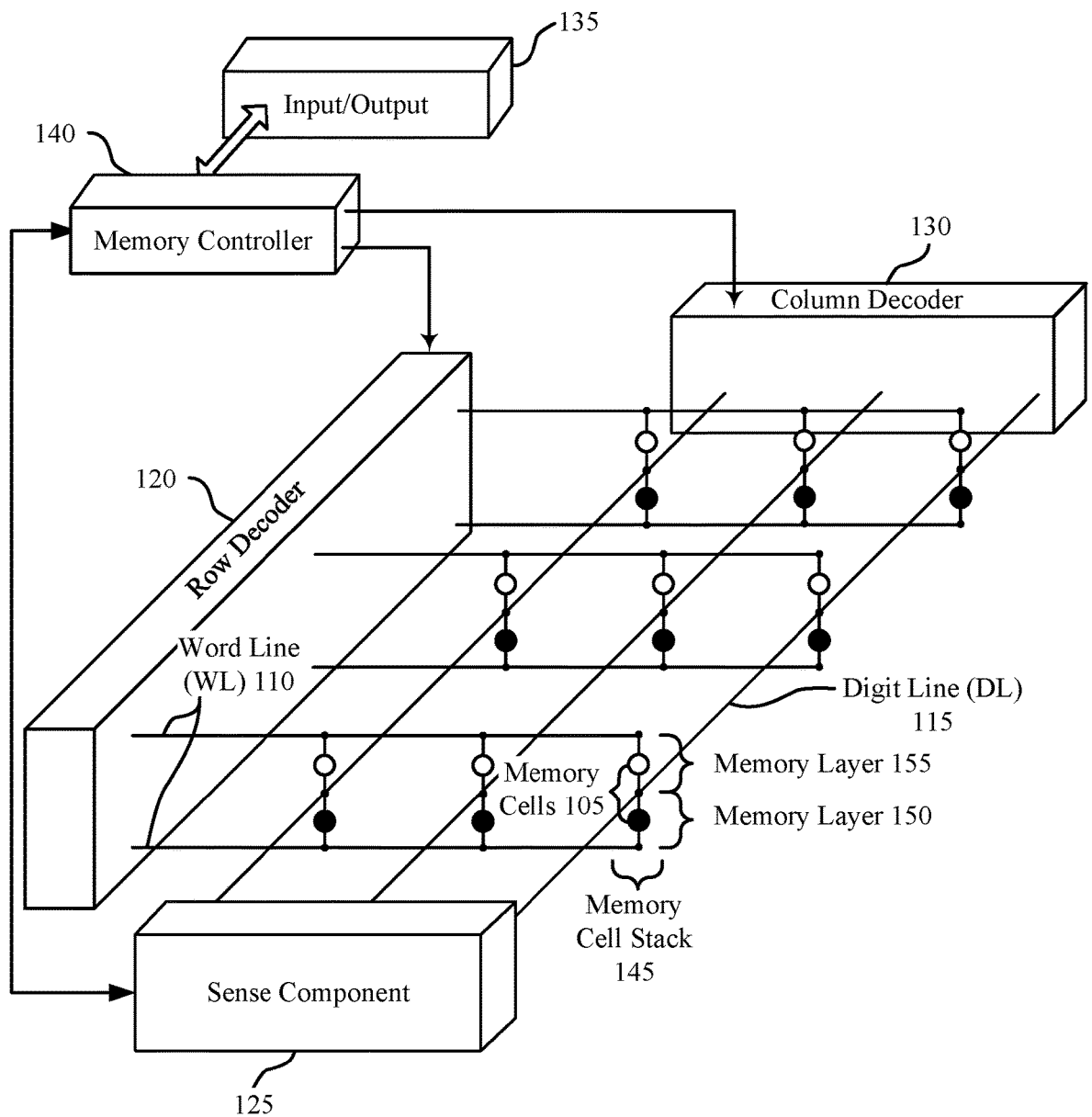
FIG. 1 illustrates an example memory array in accordance with various aspects of the present disclosure.

A device, such as a magnetoresistive random access memory (MRAM) memory device, may employ memory cells constructed with various materials, such as magnetic tunnel junction (MTJ) materials. In some examples, the MTJ materials may include a free magnetic layer that is separated from a pinned magnetic layer by a non-magnetic, tunneling layer. The pinned magnetic layer may be magnetized in the same direction, while the free magnetic layer may be capable of being magnetized in multiple directions. Different resistive states of the MTJ materials may be achieved by changing the magnetization direction (or polarization) of the free magnetic layer relative to the pinned magnetic layer, and the different resistive states may be associated with different logic values. For example, a first logic state may be associated with a low resistive state of the MTJ materials and a first magnetized direction of the free magnetic layer, and a second logic state may be associated with a high resistive state of the MTJ materials and a second magnetized direction of the free magnetic layer.

Changing the magnetization direction of a free magnetic layer in a memory cell may be accomplished electronically using an external source (e.g., a voltage or current source), which may access a desired memory cell via one or more access lines. For instance, the external source may switch the magnetization of the free magnetic layer from one direction to another by driving a spin-polarized current through the MTJ materials or by applying an electronic pulse across the MTJ materials. Switching the magnetization of the free magnetic layer using an electronic pulse may be referred to as electric field, or E-field switching. The effectiveness of E-field switching—e.g., how closely a resulting magnetization direction of the free magnetic layer is to the desired direction—may be dependent on the characteristics of the voltage pulse applied across the MTJ materials—e.g., the rise time, fall time, and/or pulse width of the electronic pulse. In some examples, E-field switching may be reliably performed with a voltage pulse having a rise time that is less than 1 nanosecond (ns).

In some examples, a memory device may include a high-density memory array having one or more external sources located on the outer edges of the memory device and one memory cell array in the middle of the memory device. The external source may be configured to generate a voltage pulse having a rise time that is configured for reliable E-field switching of MTJ materials in a desired memory cell—e.g., the voltage pulse may be configured to have a certain rise time (e.g., less than or equal to 1 ns), pulse duration, and/or fall time. However, the farther a memory cell is located from the voltage source, the higher the effect from the parasitic resistance and capacitance (which may also be referred to as intrinsic or inherent resistance or capacitance) of an access lines may be on the voltage pulse. That is, an increase in the parasitic capacitance and/or resistance of an access line may result in increased degradation of a voltage pulse seen at a corresponding memory cell, leading to a slower rise time (e.g., greater than 1 ns). Thus, the memory cells located farthest from the external source—e.g., memory cells located in the center of the memory array in some examples—may experience greater effects from parasitic elements than memory cells located near the external source, resulting in unreliable switching of the respective free magnetic layer in those memory cells.

An application of a voltage or current generated by an external source to a memory cell may be delayed for a period of time (such as a "delay period") to mitigate the effects of parasitic resistance and capacitance of an access line. For example, electric charge may be stored at a location near the memory cell (e.g., in a storage component) during the delay period, and may be released to the memory cell at a high current rate after the delay period ends. Accordingly, a voltage applied across the memory cell may be delayed relative to the generated voltage, while rising at a rate that is similar to the rise of the generated voltage. After the delayed voltage has been applied across the memory cell for a period of time, the external source may stop generating the voltage or current, and the voltage across the memory cell may quickly fall. In this way, an electric pulse with a fast rise time, desired pulse duration, and fast fall time may be applied across the memory cell, uncoupled from the parasitic effects of the access line.

For example, a selection component that is configured to delay the application of a generated voltage to a memory cell for a period of time may be introduced between an external source and a memory cell. The delay period may correspond to a time needed for a voltage applied to the selection component to reach a threshold, or turn-on, voltage of the selection component. The selection component may remain in an off-state and may store electric charge during the delay period, and may enter an on-state after the delay period expires and release the stored electric charge. The selection component may be manufactured to exhibit high current density properties; thus, the selection component may quickly transfer large amounts of the stored electric charge to the memory cell to enable fast pulse operation. Accordingly, a voltage applied to the memory cell may rapidly increase. In some cases, there may be an additional delay between turning-on the selection component and the selection component releasing the stored electric charge to the memory cell ("turn-on delay").

In some examples, each memory cell in the memory array may be in electronic communication with a selection component as described above. Some memory cells may be located closer to an external source than other memory cells—e.g., memory cells at the edge of the memory array may be closer to the external source than memory cells located at the center of the memory array. As discussed above, the farther memory cells may experience greater parasitic effects than the closer memory cells. Thus, a voltage applied to farther memory cells may take longer to reach the threshold voltage of a selection component than memory cells located near the external source. As a result, the delay period for farther memory cells may be longer than for closer memory cells.

In some examples, the delay period for a memory cell is dependent on the magnitude of a voltage generated by an external source and a threshold voltage of a selection component. The delay period may also be dependent on characteristics of an access line, including the width, length, and placement of the access line relative to other access lines. In some examples, each selection component in the memory array may have a same threshold voltage. In other examples, at least one selection component in the memory array may have a different threshold voltage than other selection components in the memory array—e.g., selection components in electronic communication with farther memory cells may have relatively lower threshold voltages.

To compensate for the difference in delay periods and to ensure reliable switching for each memory cell in the memory array, a time for generating a voltage by an external source may be set to be at least as long as the worst case delay period—e.g., the delay period needed to turn on each selection component in the memory array. In some cases, the external source may be configured to generate a voltage to be applied to a memory cell for at least as long as the worst case delay period. In some examples the external source may generate the voltage for at least as long as the worst case delay period plus the turn-on delay period and/or a desired duration for an electric pulse to be applied across a memory cell. In some examples, a same voltage is generated for each memory cell in the memory array. In other cases, different voltages are generated for different memory cells in the memory array—e.g., a relatively higher voltage is generated for farther memory cells. These and other aspects of the disclosure are further illustrated by and described with reference to apparatus diagrams, system diagrams, and flow-charts.

FIG. 1 illustrates an example memory array 100 in accordance with various aspects of the present disclosure. Memory array 100 may also be referred to as an electronic memory apparatus. Memory array 100 includes memory cells, such as memory cells 105, that are programmable to store different logic states.

Memory array 100 may be a two-dimensional (2D) memory array. In some cases, memory array 100 may be a three-dimensional (3D) memory array, where memory arrays are formed on top of one another. This may increase the number of memory cells that may be formed on a single die or substrate as compared with 2D arrays, which in turn may reduce production costs or increase the performance of the memory array, or both. Aspects of the following discussion may be similarly applied to either 2D or 3D memory arrays.

According to the example depicted in FIG. 1, memory array 100 includes two layers of memory cells 105—first memory layer 150 and second memory layer 155, and may thus, be considered a three-dimensional memory array. That said, the number of memory layers is not limited to two. Each memory layer may be aligned or positioned so that memory cells 105 may be approximately aligned with one another across each memory layer, forming a memory cell stack 145.

As shown in FIG. 1, two memory cells 105 in a memory cell stack 145 may share a common access line such as digit line 115. That is, digit line 115 may be in electronic communication with the bottom electrode of the upper memory cell 105 and the top electrode of the lower memory cell 105. Other configurations may be possible, for example, a third layer may share word line 110 with a lower memory layer, such as second memory layer 155. Or in some cases, lower memory cell 105 may be in electronic communication with digit line 115 and a word line 110, while upper memory cell 105 may be in electronic communication with a second, different digit line and a second, different word line. In general, one memory cell 105 may be located at the intersection of two access lines such as a word line 110 and a bit line 115. This intersection may be referred to as a memory cell's address.

Each memory cell 105 may be programmable to store two states, denoted a logic 0 and a logic 1. In some cases, a memory cell 105 is configured to store more than two logic states. A memory cell 105 may store charge representative of the programmable states in a capacitor; for example, a charged and uncharged capacitor may represent two logic states, respectively. Dynamic random access memory (DRAM) architectures may commonly use such a design, and the capacitor employed may include a dielectric material with linear or paraelectric electric polarization properties as the insulator. Ferroelectric RAM (FeRAM) may also use such a design, but a ferroelectric memory cell include a capacitor with a ferroelectric as the insulating material. Different levels of charge of a ferroelectric capacitor may represent different logic states. Ferroelectric materials have non-linear polarization properties.

In some cases, a memory cell 105 may include a material that has a variable and configurable electrical resistance that is representative of the logic states. Thus, instead of storing charge representative of a logic state, materials in a memory cell 105 may be programmed to have a resistance that is representative of the programmable states of the memory element. For instance, a low resistance and a high resistance state may represent two logic states, respectively. Phase change memory (PCM) may commonly use such a design, and may include phase change materials that have a different resistance after they are heated to a certain temperature. MRAM may also use this type of design, and may include magnetoresistive materials having a variable resistance that depends on the magnetization of the magnetoresistive material. Thus, the different resistances used to represent different logic states may be programmed to an MRAM memory cell by changing the magnetization direction of the magnetoresistive.

For example, the magnetoresistive material may be a magnetoresistive thin film that changes its resistance depending on the relative direction between the magnetization of the film. In another example, the magnetoresistive material may be MTJ materials composed of at least two magnetic layers separated by a conducting interlayer. The resistance of the MTJ materials may be dependent on the relative orientation between the neighboring magnetic layers. In some cases, the resistance of the material may be at a maximum when the layers are magnetized in opposite, or antiparallel, directions and may be at a minimum when the layers are magnetized in the same, or parallel, direction. In some examples, the high resistance state may be representative of a first logic state (e.g., logic 0) and the low resistance state may be representative of a second logic state (e.g., logic 1), or vice versa.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Word lines 110 and bit lines 115 may be substantially perpendicular to one another to create an array. As discussed above, a memory cell 105 may include electrodes that are coupled with a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

An access line 110 and a bit line 115 may also be a trace, wire, conductive line, or a conductive layer. Each access line 110 and bit line 115 may have inherent, or parasitic, resistance and capacitance. The inherent resistance of an access line 110 or bit line 115 may increase as the width of the conductive path decreases and/or as the length of the conductive path increases. The inherent capacitance of an access line 110 or bit line 115 may increase as an access line 110 or bit line 115 is placed closer to another access line 110 or bit line 115 and/or as the length of an access line 110 or bit line 115 increases. In a high-density array, the magnitude of the inherent resistance and capacitance of an access line 110 or bit line 115 may be increased as smaller trace widths, closer placed traces, and longer conductive paths are used to increase memory cell density in a memory array.

Memory cells 105 may be accessed to perform write, read and/or refresh operations. Access operations may be controlled through a row decoder 120 and a column decoder 130. For example, a row decoder 120 may receive a row address from the memory controller 140 and activate the appropriate word line 110 based on the received row address. Similarly, a column decoder 130 may concurrently receive a column address from the memory controller 140 and activate the appropriate bit line 115. By activating a word line 110 and a bit line 115, a memory cell 105 may be accessed for a read, write, or refresh operation.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as MRAM or PCM, accessing the memory cell 105 may not destroy the logic state and, thus, the memory cell 105 may not require re-writing after accessing. Writing, reading, and/or refreshing a logic state stored by a memory cell 105 may include applying a voltage or a current to a respective word line 110 and bit line 115.

During a write operation, a memory cell 105 may be set, or written, by activating a relevant word line 110 and bit line 115—e.g., a logic value may be stored in the memory cell 105. Column decoder 130 or row decoder 120 may accept data, for example input 135, to be written to the memory cells 105. A memory cell 105 using magnetoresistive materials, such as MTJ materials, may be programmed to either a high resistance state or a low resistance state by applying either a current or voltage to the memory cell. For instance, a resistance state of the MTJ materials by be programmed by driving a spin-polarized current through the MTJ materials or by applying voltage pulses across or current pulses to the MTJ materials. The amplitude, duration, and/or number of programming pulses may be adjusted in order to program the cells to one of a number of different resistance levels.

E-field switching may refer to a writing method that is accomplished by applying a voltage pulse across the MTJ materials. E-field switching may cause switching (e.g., toggle-like switching) of a free layer of the MTJ materials due to magnetic precession, and thus, switching may be accomplished using voltage pulses having a single polarity. The effectiveness of E-field switching may be dependent on, the pulse duration, rise time, and/or fall time of the electric pulse. As discussed above, some memory cells in a memory array 100 may be located farther from a voltage source that produces the electric pulse, and parasitic characteristics of the access lines used to access the memory cell may degrade the electric pulse applied across these memory cells. When a degraded electric pulse is applied across MTJ materials of a memory cell 105, the magnetic direction of the free layer may be programmed in an incorrect or undesirable direction. Thus, the memory cell 105 may have a resistance that is not indicative of the intended logic state.

During a read operation, a memory cell 105 may similarly be selected by activating the relevant word line 110 and bit line 115, and the resulting signal may be used to determine the stored logic state. For example, a voltage may be applied via the word line 110 and bit line 115, and the resulting current may be used to differentiate between the resistive states of a magnetoresistive material. For instance, a first logic state may correspond to a first current when the magnetoresistive material is in a high resistance state, whereas a second logic state may correspond to a second, larger current when the magnetoresistive material is in a low resistance state. In another example, a common current may be driven through a memory cell 105, and a resulting voltage on a digit line may be used to differentiate between the resistive states of the magnetoresistive material. For instance, a first logic state may correspond to a first voltage when the magnetoresistive material is in a high resistance state, whereas a second logic state may correspond to a second, smaller voltage when the magnetoresistive material is in a low resistance state.

During or after the read operation, the signal resulting from reading a memory cell 105 may be sensed by sense component 125 and used to determine the stored logic state of the memory cell 105. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the presence of a resulting current may depend on the applied voltage and the threshold voltage of the memory cell 105.

In some cases, more than one voltage may be applied. For example, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the total threshold voltage of the memory cell 105.

Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may connected to or in electronic communication with column decoder 130 or row decoder 120.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile memory cells may have beneficial properties that may result in improved performance relative to other memory architectures. For example, MRAM may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
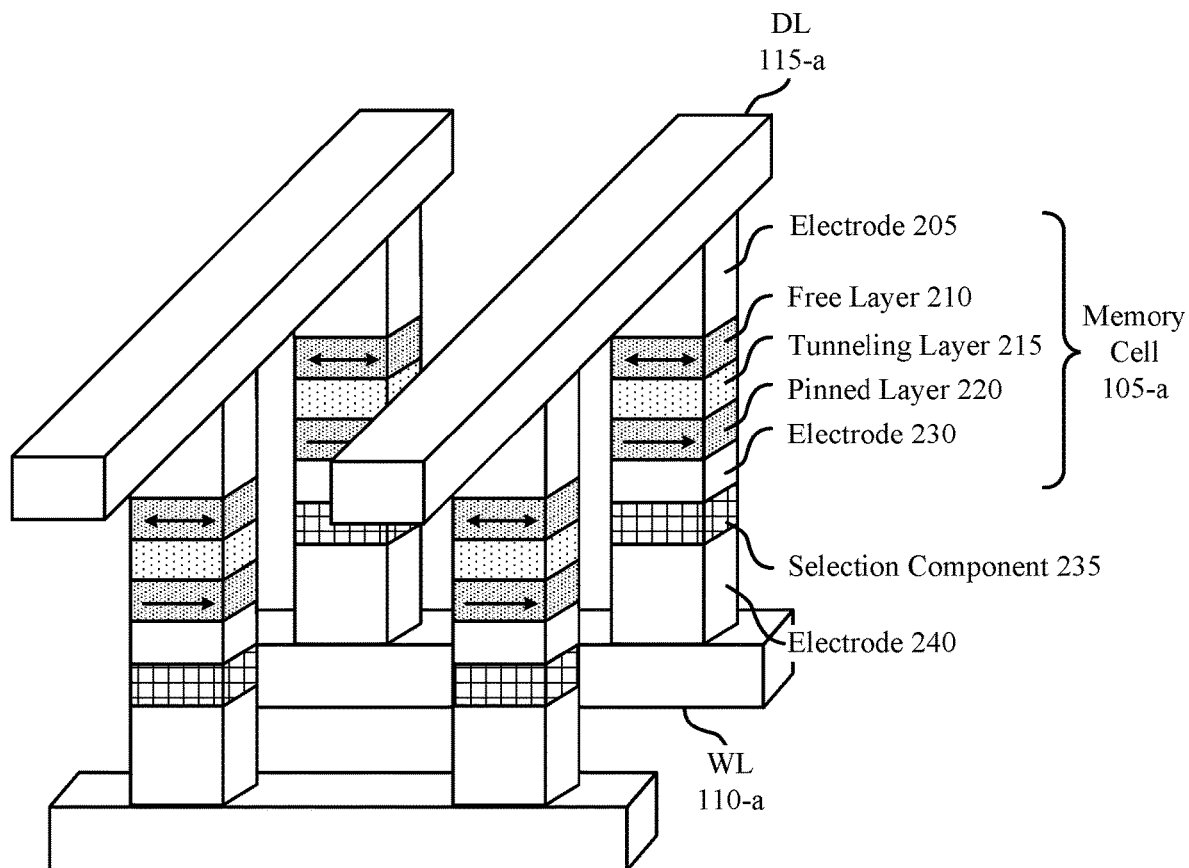
FIG. 2 illustrates a 3D representation of an example memory array portion that supports fast pulse operation in accordance with various aspects of the present disclosure.

In some examples, memory controller 140 may identify a threshold voltage of a selection component coupled with a word line 110 and memory cell 105 that corresponds to a voltage at which the selection component is configured to release a stored electric charge. memory controller 140 may also determine a requisite duration for a first voltage to be applied to the access line for the selection component to reach the threshold voltage. And memory controller 140 may operate column decoder 130 and row decoder 120 and apply the first voltage to the access line for at least the requisite duration, causing electric charge stored at the selection component during the requisite duration to be transferred to the memory cell after the requisite duration FIG. 2 illustrates a 3D representation of an example memory array portion 200 that supports fast pulse operation in accordance with various aspects of the present disclosure. Memory array portion 200 may be an example portion of memory array 100 with reference to FIG. 1. Memory array portion 200 includes memory cells, such as memory cell 105-*a*, word lines, such as word line 110-*a*, and bit lines, such as bit line 115-*a*, which may be examples of a memory cell 105, word line 110, and bit line 115, as described with reference to FIG. 1. Memory array portion 200 may also include selection components, such as selection component 235, and electrodes, such as third electrode 240.

In some cases, a 3D memory array may be formed by stacking multiple memory array portions 200 on one another. In some cases, the two stacked arrays may have common access lines such that each level may share word lines 110 or bit lines 115 as described with reference to FIG. 1. Memory array portion 200 may be made by various combinations of material formation and removal. For example, layers of material may be deposited that correspond to word line 110-*a*, third electrode 240, selection component 235, second electrode 230, pinned layer 220, tunneling layer 215, free layer 210, and first electrode 205. Material may be selectively removed to then create the desired features, such as the pillar structure depicted in FIG. 2. For example, features may be defined using photolithography to pattern a photoresist and then material may be removed by techniques such as etching. Bit lines 115-*a* may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array portion 200. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Memory cells 105-*a* of FIG. 2 may use MTJ materials that are programmable to a desired resistance. For instance, memory cell 105-*a* may include first electrode 205 (or "top electrode"), free layer 210, tunneling layer 215, pinned layer 220, and second electrode 230 (or "bottom electrode"). Pinned layer 220 may be a magnetic layer, and may be formed as a ferromagnetic film. The materials of pinned layer 220 may be configured to remain magnetized in a single direction. The single-headed arrow illustrated in pinned layer 220 indicates the magnetization direction of the material in pinned layer 220. Free layer 210 may also be a magnetic layer, and may be formed as a ferromagnetic film. The magnetization of the materials in free layer 210 may be configurable in a number of direction. The double-headed arrow illustrated in free layer 210 indicates alternative magnetization directions of the material in free layer 210. Tunneling layer 215 may be a multiferroic material and can exhibit coupled ferroelectricity and ferromagnetism and/or anti ferromagnetism. Example materials that may be used for tunneling layer 215 include $BiFeO_3$ (BFO), $TbMn_2O_5$, $TbMnO_3$, $Bi_4Fe_2TiO_{12}$, or $NiBi_2O_4$.

Selection component 235 may, in some cases, be connected in series between a memory cell 105-*a* and at least one conductive line such as a word line 110-*a* or a bit line 115-*a*. For example, as depicted in FIG. 2, selection component 235 may be located between second electrode 230 and third electrode 240; thus, selection component 235 is located in series between memory cell 105-*a* and word line 110-*a*. Other configurations are possible. For example, selection component 235 may be located in series between memory cell 105-*a* and bit line 115-*a*. The selection component 235 may aid in selecting a particular memory cell 105-*a* or may help prevent stray currents from flowing through non-selected memory cells adjacent a selected memory cell 105-*a*. Selection component 235 may include an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some examples, selection component 235 may be an alloy of selenium (Se), arsenic (As), and germanium (Ge). In some examples, selection component 235 may be a filament-based device.

In some cases, selection component 235 is a Cu-diode composed of a Cu-chalcogenide material that operates to close—e.g. create a conductive path between word line 110-*a* and second electrode 230—selection component 235 through the bulk movement of Cu ions. Using Cu ions to close selection component 235 enables selection component 235 to quickly passes large amounts of current—e.g., $$\sim 1.43 * 10^3 \left(\frac{\mu A}{ns}\right)$$

—through the selection component upon close. In other words, a Cu-diode may have a high ON-state current density $$\left(\sim 50 \frac{MegaAmperes}{cm^2}\right)$$

(i.e., a low resistance ON state), and thus may be capable of conducting high currents (e.g., greater than 8 microamperes) through a small cross-sectional area. A Cu-diode may also have a low OFF-state leakage current (<10 nanoamperes) (i.e., a high resistance OFF state) to prevent leakage through unselected memory cells located along word line 110-*a*. Thus, a Cu-diode may have a highly nonlinear I-V curve. A Cu-diode may have a threshold voltage, or turn-on voltage, that is higher than an operating voltage of memory cell 105-*a*. In some cases, a Cu-diode exhibits a delay period between a time when a voltage applied across the Cu-diode reaches the threshold voltage and a time when the Cu-diode begins to conduct current, which may be referred to as turn-on delay. In some examples, the length of the turn-on delay may be dependent on a magnitude of a threshold voltage of the Cu-diode. The Cu-diode may remain in the low resistance ON state until the voltage across the Cu-diode is removed (i.e., approximately 0 V) before returning to the low resistance OFF state.

As previously discussed, various logic states may be stored by programming the electrical resistance of memory cell 105-a. For example, an MRAM device may exploit the large resistance contrast between an antiparallel and a parallel alignment of the free and pinned magnetic layers in an MTJ material. For instance, when the free layer 210 and the pinned layer 220 are magnetized in the same, or parallel, directions, the MTJ materials may exhibit a relatively low electrical resistance. By contrast, when free layer 210 and pinned layer 220 are magnetized in opposite, or antiparallel, directions, the MTJ materials may exhibit a relatively high electrical resistance.

In some cases, free layer 210 and pinned layer 220 may be magnetized in an intermediary state between antiparallel and parallel and the resistance may be of some value between the resistances associated with the antiparallel and parallel states. So the MTJ materials may be used for other than binary logic applications—e.g., the number of possible states stored in MTJ materials may be more than two. The resistive state of memory cell 105-a may be set by driving a spin-polarized current through memory cell 105-a or applying an electric pulse across memory cell 105-a. For example, an electric pulse may be applied across memory cell 105-a by applying a voltage pulse to the word line 110-a and maintaining bit line 115-a at a ground reference.

To set a low-resistance state using E-field switching, an electric pulse may be applied across memory cell 105-a that results in free layer 210 being polarized in the same direction as pinned layer 220. To set a high-resistance state using E-field switching, another electric pulse of the same polarity as the first electric pulse may be applied across memory cell 105-a that results in free layer 210 being polarized in the opposite direction as pinned layer 220. The magnitude and/or duration of the electric pulse applied across memory cell 105-a may determine the magnetization direction of free layer 210.

For instance, for thermally activated voltage control of magnetic anisotropy (VCMA)-induced switching, the magnetization direction of free layer 210 may be dependent on the magnitude of the voltage applied across memory cell 105-a. While for precessional VCMA-induced switching, the magnetization direction of free layer 210 may be dependent on the duration of the electric pulse. Note that for both techniques, memory cell 105-a may be written using a unipolar electric pulse; that is, both logic states can be written with electric pulses having the same polarity of voltage. Also note that thermally activated VCMA may be assisted by a spin-transfer torque (STT) current, while no STT current may be used with precessional VCMA-induced switching.

As previously discussed, word line 110-a and bit line 115-a may have an inherent resistance and capacitance. In some examples, the inherent capacitances of word line 110-a and bit line 115-a may be based on their distance from the other word and bit lines in the memory array portion 200, respectively. And the inherent resistance of word line 110-a and bit line 115-a may be based on their length and widths, as well as their underlying materials. The inherent resistance and capacitance of word line 110-a degrade a voltage pulse that is applied by a voltage source at a start of word line 110-a by the time the voltage pulse reaches memory cell 105-a. Thus, the resulting voltage pulse that presents at memory cell 105-a may have undesirable qualities, such as a slow rise time and an attenuated magnitude.

Since the reliability of E-field switching may depend on the shape and duration of the electric pulse applied across memory cell 105-a, any degradation of the applied voltage pulse may be problematic. Selection component 235 may mitigate the effects of the parasitic elements in word line 110-a by storing electric charge until the voltage applied at or near third electrode 240 reaches a threshold voltage of selection component 235. Once the threshold voltage is reached, selection component may quickly transfer a large amount of the stored charge to second electrode 230, causing a sharp rise of the voltage at second electrode 230 until the voltage reaches a peak voltage. The threshold voltage of selection component 235 may be selected to be at least as large as the peak voltage, which may be an operating voltage of memory cell 105-a. And when the voltage generated by the voltage source is removed, the voltage at second electrode 230 may fall until selection component 235 enters an OFF-state at a lower voltage (e.g., near virtual ground). Thus, the voltage applied across memory cell 105-a may exhibit similar properties as the voltage generated by the voltage source.

The resistive state of the memory cell 105-a may be determined by driving a known current through memory cell 105-a and comparing the induced voltage on digit line 115-a with a reference voltage. For instance, if the induced voltage is greater than the reference, it may be determined that memory cell 105-a is in the high resistance state. In another example, the resistive state of the memory cell 105-a may be measured by applying a voltage across memory cell 105-a and comparing the induced current against a reference current. For instance, if the induced current is lower than the reference current, it may be determined that memory cell 105-a is in the high resistance state.

In some examples, memory array portion 200 may be constructed in a 1R-1T configuration so that selection component is replaced with a three terminal transistor, such as a thin-film transistor. To support the transistor, a third access line may be introduced to memory array portion 200, which may increase the size of the array and decrease memory cell density. In a 1R-1T configuration, memory cell 105-a may be written by first activating the transistor and then driving a spin-polarized current through memory cell 105-a, polarizing free layer 210 in the same or opposite direction as pinned layer 220.

Figure 3:
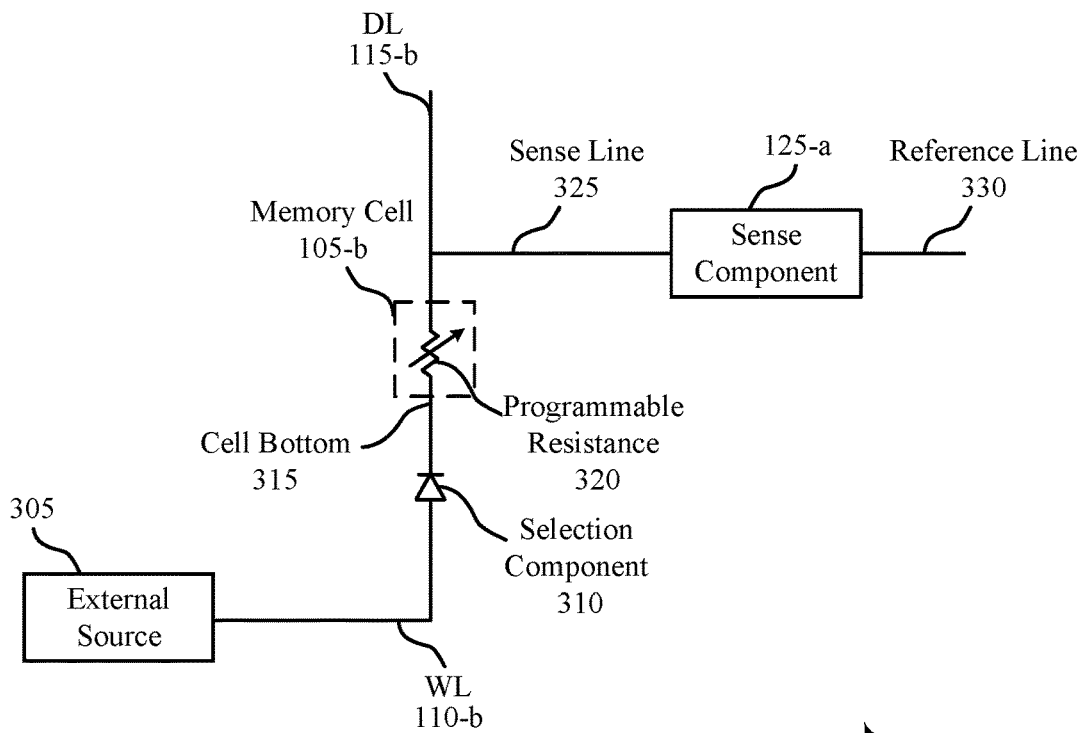
FIG. 3 illustrates an example circuit that supports fast pulse operation in accordance with various aspects of the present disclosure.

FIG. 3 illustrates an example circuit 300 that supports fast pulse operation in accordance with various aspects of the present disclosure. Circuit 300 includes memory cell 105-b, word line 110-b, digit line 115-b, and sense component 125-a, which may be respective examples of a memory cell 105, a word line 110, a digit line 115-b, and a sense component 125 of FIGS. 1-2. Memory cell 105-b may include programmable resistance 320. Circuit 300 also includes external source 305, cell bottom 315, selection component 310, sense line 325, and reference line 330. Selection component 310 may be an example of a selection component 235 of FIG. 2.

External source 305 may be in electronic communication with word line 110-b. Word line 110-b may be in electronic communication with selection component 310 and external source 305. Selection component 310 may be in electronic communication with word line 110-b and cell bottom 315. Cell bottom 315 may be in electronic communication with programmable resistance 320 and selection component 310. Programmable resistance 320 may be in electronic communication with cell bottom 315, digit line 115-b, and sense line 325. Sense line 325 may be in electronic communication with digit line 115-b and sense component 125-a. Sense component 125-*a* may be in electronic communication with sense line 325 and reference line 330. More generally, note that each of the components in circuit 300 may be electronic communication with the other components in circuit 300.

External source 305 may be configured to generate an electric pulse having a rise time, pulse duration, and/or fall time that is sufficient (e.g., with a fast enough rise or fall time, with a long enough pulse duration) to electronically program a resistance of a programmable resistance, such as programmable resistance 320, to a desired resistance level. External source 305 may be either a voltage source or a current source. In some cases, the electric pulse may be created using voltage potentials. External source 305 may be constructed using a number of components (e.g., transistors) that are arranged to maximize the slew rate of an output voltage output of external source 305. In some examples, external source 305 may be located on the periphery of a memory array (e.g., a high density memory array) and may be a closer in distance to some memory cells than other memory cells in the memory array.

Selection component 310 may be used to delay or regulate the application of an electric pulse to memory cell 105-*b*. Selection component 310 may additionally be used to supply an electric pulse to memory cell with a desired rise time, duration, and/or fall time by providing a large amount of current when selection component 310 is activated. In some cases, selection component 235 is a two terminal device, such as a diode. In some examples, selection component 235 is a copper diode. Selection component 310 may isolate cell bottom 315 from word line 110-*b* when the voltage across selection component 310 is below a threshold voltage of selection component 310.

In some cases, selection component 310 is constructed to have a threshold voltage. For instance, selection component 310 may be constructed so that the threshold voltage is equal to or great than a voltage used to operate memory cell 105-*b*. When voltage below the threshold voltage is applied to selection component 310, selection component 310 may store electric charge. Selection component 310 may release the stored electric charge (e.g., voltage, current) when the threshold voltage is exceeded. In some cases, selection component 310 exhibits a turn-on delay (e.g., which may be ~50 ns) between a time when a voltage across selection component 310 exceeds the threshold voltage and a time when selection component 310 releases any stored electric charge. In some cases, a resistance of the selection component is a first value when a voltage across the selection component is below the threshold voltage, and wherein the resistance of the selection component is a second value lower than the first value when the voltage across the selection component is higher than the threshold voltage.

Cell bottom 315 may couple selection component 310 with programmable resistance 320. Cell bottom 315 may be a wire, a conductive trace, a conductive layer, and the like. For instance, cell bottom 315 may be an electrode that is disposed between selection component 310 and programmable resistance 320.

Programmable resistance 320 may be programmed to have different resistances that correspond to and are used to represent different logic states. Programmable resistance 320 may include MTJ materials including a free magnetic layer, a tunneling layer, and a pinned magnetic layer. Programmable resistance 320 may be programmed by driving a spin-polarized current through memory cell 105-*b* or by applying an electric pulse across memory cell 105-*b*. Programmable resistance 320 may include a high resistance state, which may correspond to a time when the free magnetic layer and pinned magnetic layer are antiparallel, and a low resistance state, which may correspond to a time when the free magnetic layer and pinned magnetic layer are parallel. Intermediate resistance states may also be possible.

Sense line 325 may provide a voltage or current measurement of digit line 115-*b* to sense component 125-*a*. For example, sense line 325 may be used to sense a magnitude of a current being driven through memory cell 105-*b* or a magnitude of a voltage induced on digit line 115-*b* by driving a current through memory cell 105-*b*. In some examples, the voltage induced on digit line 115-*b* by a common current is greater when programmable resistance 320 is in a high resistance state than when programmable resistance 320 is in a low resistance state.

Reference line 330 may provide a reference voltage or current to sense component 125-*a*. Reference line 330 may provide an intermediary voltage having a magnitude that is between a voltage of digit line 115-*b* corresponding to a high resistance state being programmed to programmable resistance 320 and a low resistance state being programmed to programmable resistance 320.

Sense component 125-*a* may be used to determine the resistive state of programmable resistance 320 and, by extension, the logic state programmed to programmable resistance 320. Sense component 125-*a* may compare a voltage or current provided by sense line 325 with a voltage or current provided by reference line to determine the programmed resistance of programmable resistance 320. For example, sense component 125-*a* may output a high voltage if the voltage of sense line 325 is higher than the voltage of reference line 330. Sense component 125-*a* and/or a memory controller coupled with sense component 125-*a* may then determine that programmable resistance 320 is programmed into a high resistance state. Accordingly, sense component 125-*a* and/or the memory controller may also determine the logic state stored by memory cell 105-*b* by mapping the determination of the high resistance state to a corresponding logic state (e.g., a logic 1).

In some examples, when a voltage is generated by external source 305, selection component 310 may store charge until the voltage across selection component 310 reaches a corresponding voltage threshold. As previously discussed, the voltage applied to selection component 310 may rise slower than the rise of the voltage generated by external source 305 due to inherent resistance and capacitance in word line 110-*b*. Once the voltage across selection component 310 exceeds the threshold voltage, selection component 310 may transition to an activated or "ON" state and may quickly release the charge stored at selection component 310 onto cell bottom 315. Thus, the voltage of cell bottom 315 may rapidly rise with a rise time that is similar to the rise time of the voltage generated by external source 305. Accordingly, the voltage across memory cell 105-*b* may also rise with a rise time that is similar to the rise time of the voltage generated by external source 305, for example, if digit line 115-*b* is held at a ground or virtual ground reference (e.g., 0V).

When external source 305 stops generating the voltage (e.g., is deactivated), the voltage applied to selection component 310 may drop and the voltage at cell bottom 315 may decrease. Thus, the voltage across memory cell 105-*b* may decrease. The voltage at cell bottom 315 may continue to decrease until selection component 310 turns "OFF", which may occur when the voltage across selection component 310 is lower than the threshold voltage or at or near virtual ground. If programmable resistance 320 uses MTJ materials, the electric pulse resulting across memory cell 105-*b* may switch a free magnetic layer of programmable resistance 320 from one direction to another, changing the resistance of memory cell 105-b. A memory array may apply an electric pulse across memory cell 105-b to write a desired logic state to memory cell 105-b.

Figure 4:
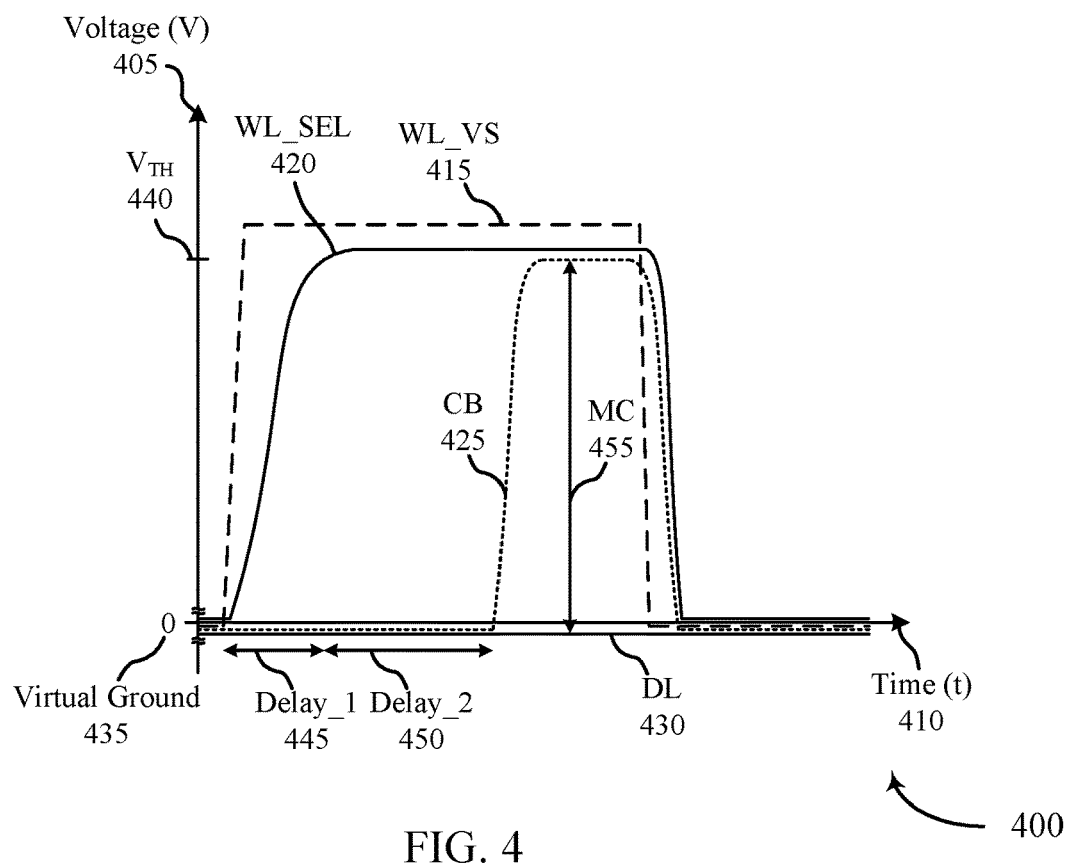
FIG. 4 illustrates a timing diagram for fast pulse operation in accordance with various aspects of the present disclosure.

FIG. 4 illustrates a timing diagram 400 for fast pulse operation in accordance with various aspects of the present disclosure. Timing diagram 400 depicts an example operation of circuit 300 described with reference to FIG. 3, and is described below with reference to components of other figures. Note that voltages that are approximately equal to or approach zero may be offset from the origin for ease of representation and understanding. In some cases, timing diagram 400 is representative of a write operation to memory cell 105-b, during which a memory array programs programmable resistance 320 to a resistive state indicative of a desired logic state. The memory array may program the desired resistive state by generating an electric pulse across memory cell 105-b, which may configure the polarity of a free magnetic layer of MTJ materials in a desired direction.

Timing diagram 400 depicts voltage on axis 405 and time on axis 410. Timing diagram 400 includes a line representing a voltage measured near external source 305 and at the beginning of word line 110-b of FIG. 3, labeled as WL_VS 415; a line representing a voltage measured near selection component 310 and at an end of word line 110-b of FIG. 3, labeled as WL_SEL 420; a line representing a voltage measured at cell bottom 315 of FIG. 3, labeled as CB 425; and a line representing a voltage measured at digit line 115-b of FIG. 3, labeled as DL 430. Timing diagram 400 also represents virtual ground 435, a threshold voltage 440 (e.g., a turn-on voltage), first delay 445, second delay 450, and a voltage across memory cell 105-b, labeled as MC 455.

In one example, external source 305 generates a voltage having desired characteristics—e.g., a rise time, pulse width, and fall time that is sufficient for reliable E-field switching (e.g., of MTJ materials) and magnitude, and applies the voltage to word line 110-b. Accordingly, WL_VS 415 may rise to the desired magnitude. Due to parasitic resistance and capacitance in word line 110-b, WL_SEL 420 may rise at a slower rate and may also have a peak that is below the peak of WL_VS 415 due to a voltage drop over word line 110-b. As WL_SEL 420 rises, selection component 310 may store electric charge provided by external source 305, while minimizing leakage current onto cell bottom 315.

When WL_SEL 420 reaches threshold voltage 440, selection component 310 may transition into an active, or ON, state. The time between the source generating the voltage and the voltage on WL_SEL 420 reaching the threshold voltage may be represented by first delay 445. The duration of first delay 445 may be between 0-30 ns. In some cases, selection component 310 may experience a delay between entering the ON state and transferring the stored electric charge to cell bottom 315, which may be represented by second delay 450. The duration of second delay 450 may be approximately 50 ns. Thus, the duration of first delay 445 and second delay 450 together may be approximately 50-80 ns.

In some examples, selection component 310 may have high current density properties. Thus, after the second delay expires, selection component 310 may quickly release a large amount of current onto cell bottom 315, and CB 425 may quickly rise to or near the threshold voltage (e.g., quick rising in <1 ns). In some cases, CB 425 rises as fast as or faster than WL_VS 415. In some examples, the peak of CB 425 may be slightly below the peak of WL_SEL 420 due to a voltage drop over selection component 310 and increased voltage drop over word line 110-b due to an increase in current.

The voltage across memory cell 105-b, MC 455, may include the difference between CB 425 and DL 430. In some cases, the memory array may hold the voltage of digit line 115-b at or near virtual ground 435 when external source 305 generates the voltage. Thus, the voltage across memory cell 105-b, MC 455, may be equivalent to or similar to the voltage across CB 425 and may share at least some characteristics (e.g., rise time, duration, and fall time) of CB 425.

In some cases, the memory array (e.g., a memory controller in the memory array) may determine a requisite duration for WL_SEL 420 to reach the threshold voltage 440—e.g., based on models or previous testing—which may be equivalent to first delay 445. In some cases, the requisite duration is determined based on the estimated delay required to reach a threshold voltage and for selection component 310 to turn on and release its charge—e.g., is based on first delay 445 and second delay 450. In some examples, the requisite duration is dependent on the temperature of the array or of certain areas of the array. For instance, the requisite duration may be lengthened or shortened to compensate for average variations in delay caused by temperature changes. In some cases, external source 305 may continue to apply a voltage to word line 110-b for a time period after the end of second delay 450, which may correspond to a desired duration of the electric pulse applied across memory cell 105-b. After applying the voltage for at least the requisite duration, external source 305 may stop generating the voltage and WL_VS 415 may rapidly decrease to virtual ground 435. WL_SEL 420 and CB_425 may follow WL_VS 415 as the capacitance on word line 110-b quickly discharges, and selection component 310 may transition to an OFF state (e.g., the selection component may return to a high resistance state) near when the voltage across selection component 310 nears virtual ground 435.

Figure 5:
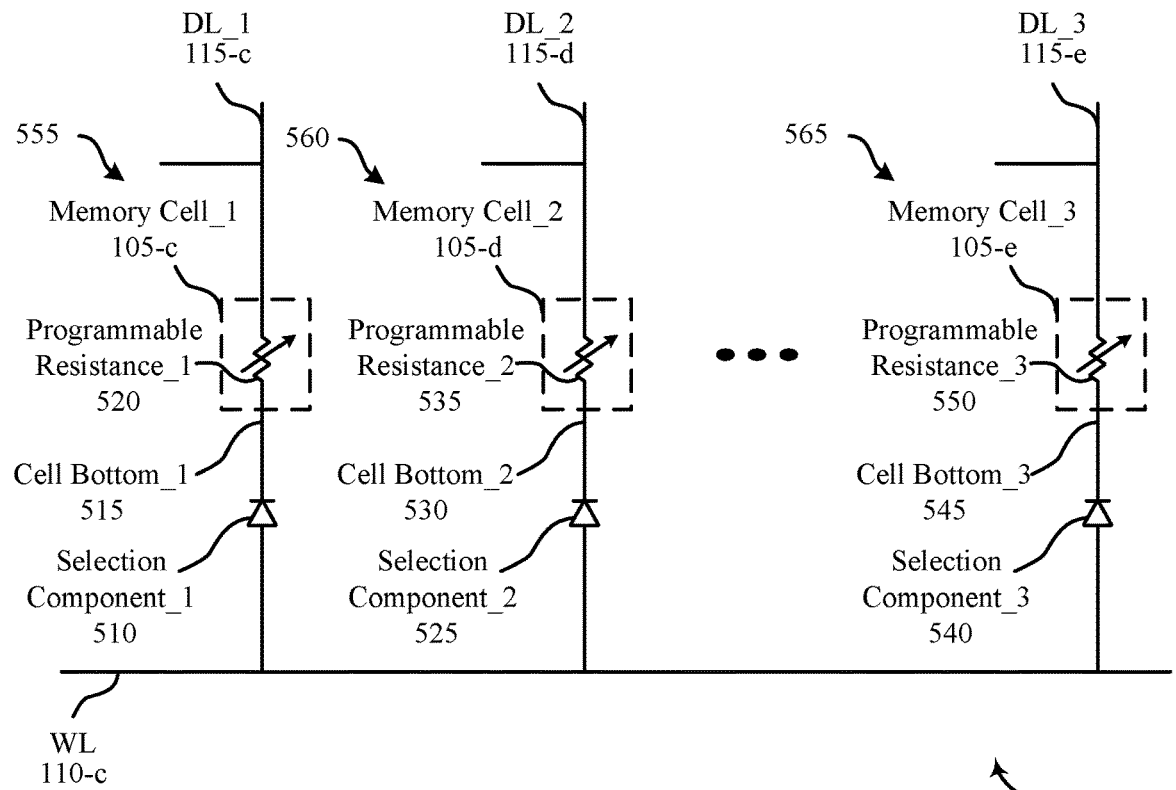
FIG. 5 illustrates an example circuit that supports fast pulse operation in accordance with various aspects of the present disclosure.

FIG. 5 illustrates an example circuit 500 that supports fast pulse operation in accordance with various aspects of the present disclosure. Circuit 500 includes first sub-circuit 555, second sub-circuit 560, and third sub-circuit 565. First sub-circuit 555 may include a first selection component 510, a first cell bottom 515, and a memory cell 105-c, which may include a first programmable resistance 520. First sub-circuit 555 may be in electronic communication with a first digit line 115-c and word line 110-c. Second sub-circuit 560 may include a second selection component 525, a second cell bottom 530, and a memory cell 105-d, which may include a second programmable resistance 535. Second sub-circuit 560 may be in electronic communication with a second digit line 115-d and word line 110-c. Third sub-circuit 565 may include a third selection component 540, a third cell bottom 545, and a memory cell 105-e, which may include a third programmable resistance 550. Third sub-circuit 565 may be in electronic communication with a third digit line 115-e and word line 110-c. First sub-circuit 565 may be a first distance from an external source, second sub-circuit 560 may be a second distance from the external source, and third sub-circuit 565 may be a third distance from an external source. In some examples, third distance is larger than first and second distance.

First memory cell 105-c, second memory cell 105-d, third memory cell 105-e, word line 110-c, first digit line 115-c, second digit line 115-d, and third digit line 115-e may be examples of a memory cell 105, a word line 110, and a digit line 115 of FIGS. 1-3. First selection component 510, second selection component 525, third selection component 540, first cell bottom 515, second cell bottom 530, third cell bottom 545, first programmable resistance 520, second programmable resistance 535, third programmable resistance 550 may be respective examples of a selection component 310, cell bottom 315, and programmable resistance 320 of FIG. 3.

In some examples, word line 110-c is in electronic communication with and used to access multiple memory cells, include first memory cell 105-c, second memory cell 105-d, and third memory cell 105-e. A single memory cell may be selected by applying a first voltage to word line 110-c and a second voltage to the digit line corresponding to the desired memory cell. For example, memory cell 105-e may be accessed by applying a first voltage (e.g., a positive voltage) to word line 110-c, while applying a second, lower voltage (e.g., virtual ground) to third digit line 115-e.

In some examples, first selection component 510, second selection component 525, and third selection component 540 may all be constructed to have a similar turn-on delay time and threshold voltage. In other examples, first selection component 510, second selection component 525, and third selection component 540 may be constructed with different turn-on delays and threshold voltages. For instance, first selection component 510 may be designed with a higher threshold voltage and longer turn-on delay than third selection component 540. In this way, a memory array may be configured to align a timing of the application of an electric pulse to memory cells across the memory array.

Certain memory cells accessed using word line 110-c may experience greater effects from the parasitic resistance and capacitance of word line 110-c. For instance, third memory cell 105-e may be located near an end, relative to a voltage source, of word line 110-c and may observe a degraded voltage signal as compared to first memory cell 105-c which may be located closer to the voltage source. For example, it may take longer for a resulting voltage at third selection component 540 to reach the threshold voltage of third selection component 540 than for a resulting voltage at first selection component 510 to reach the threshold voltage of first selection component 510. In some cases, the memory array may determine the worst case timing for operating a memory cell in the memory array, and may configure the voltage source to apply a voltage for at least a duration corresponding to the worst case timing (e.g., longest duration for one of the selection components to reach a threshold voltage).

Figure 6:
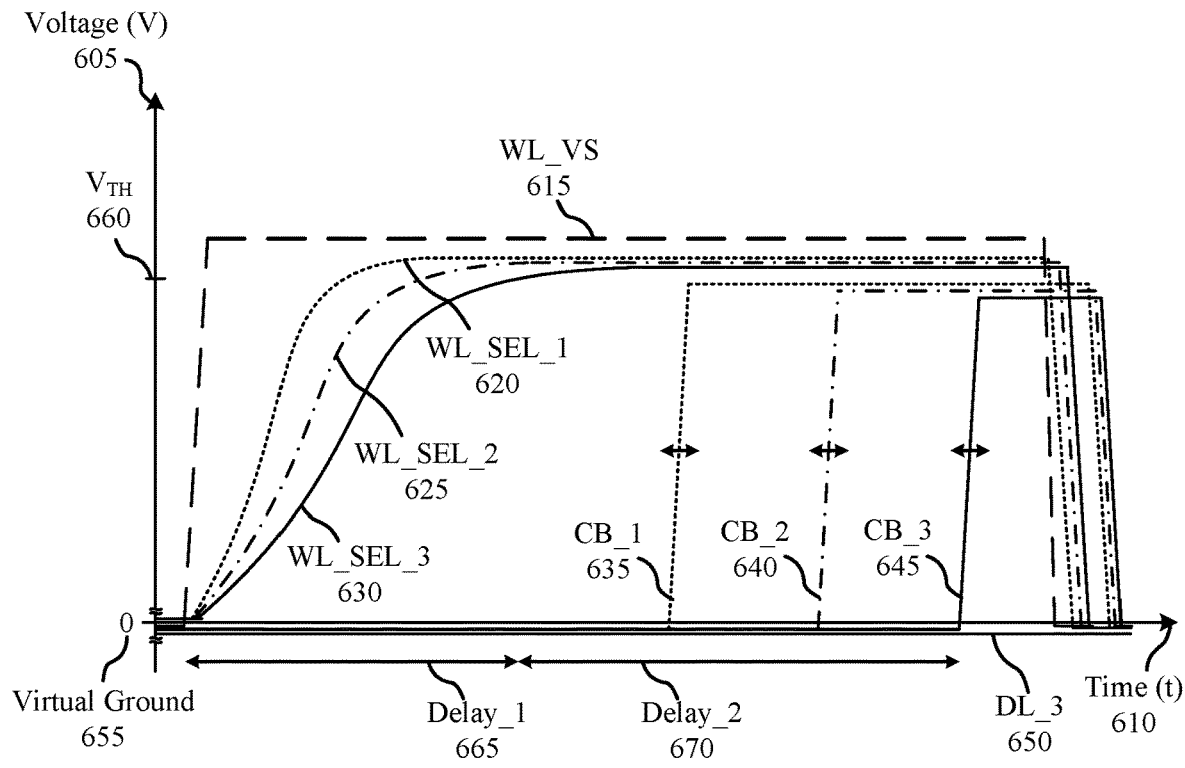
FIG. 6 illustrates a timing diagram for fast pulse operation in accordance with various aspects of the present disclosure.

FIG. 6 illustrates a timing diagram 600 for fast pulse operation in accordance with various aspects of the present disclosure. Timing diagram 600 depicts an example operation of circuit 500 described with reference to FIG. 5, and is described below with reference to components of preceding figures. Note that voltages that are approximately equal to or approach zero may be offset from the origin for ease of representation. In some cases, timing diagram 600 is representative of a write operation to memory cell 105-e during which a memory array programs programmable resistance 550 to a resistive state indicative of a desired logic state. The memory array may switch the polarity of a free magnetic layer of MTJ materials to program the desired resistive state by generating an electric pulse across memory cell 105-e.

Timing diagram 600 depicts voltage on axis 605 and time on axis 610. Timing diagram 600 includes a line representing a voltage measured near a voltage source and at the beginning of word line 110-c of FIG. 5, labeled as WL_VS 615; a line representing a voltage measured near first selection component 510 of FIG. 5, labeled as WL_SEL_1 620; a line representing a voltage measured near second selection component 525 of FIG. 5, labeled as WL_SEL_2 625; a line representing a voltage measured near third selection component 540 of FIG. 5, labeled as WL_SEL_3 630; a line representing a voltage measured at first cell bottom 515 of FIG. 5, labeled as CB_1 635; a line representing a voltage measured at second cell bottom 530 of FIG. 5, labeled as CB_2 640; a line representing a voltage measured at third cell bottom 545 of FIG. 5, labeled as CB_3 645; and a line representing a voltage measured at digit line 115-e of FIG. 5, labeled as DL_3 650. Timing diagram 400 also represents virtual ground 655, a threshold voltage 660 (e.g., a turn-on voltage), first delay 665 and second delay 670.

In one example, a voltage source generates a voltage having a desired rise time—e.g., a rise time that is sufficient for reliable E-field switching of MTJ materials—and magnitude and applies the voltage to word line 110-c. Accordingly, WL_VS 615 may quickly rise to the desired magnitude, and resulting voltages WL_SEL_1 620, WL_SEL_2 625, and WL_SEL_3 630 may also rise. Due to parasitic elements, WL_SEL_1 620 rises faster than WL_SEL_3 630 when third selection component 540 is located farther from the voltage source than first selection component 510. Thus, the voltage across first selection component 510 may reach threshold voltage 660 before the voltage across third selection component 540 reaches threshold voltage 660, represented by first delay 665.

After a delay period associated with turning on first selection component 510, CB_1 635 may rise at a faster rate relative to WL_SEL_1 620; however, an electric pulse may not be applied across memory cell 105-b if a voltage at or near threshold voltage 660 is applied to digit line 115-c. After another delay period associated with turning on third selection component 540, represented by second delay 670, CB_3 645 may rise with at a faster rate relative to WL_SEL_3 630. To access memory cell 105-e, a memory array, may concurrently apply a low voltage, such as virtual ground 655, to digit line 115-e. Thus, a voltage may be applied across memory cell 105-e.

After applying the voltage for at least as long as the first delay 665 and second delay 670 periods, the voltage source may stop applying the voltage to word line 110-c. In some cases, voltage source continues to apply the voltage for a predetermined duration after the first delay 665 and second delay 670 periods have ended before removing the voltage from word line 110-c. Thus, an electric pulse may be applied across memory cell 105-e.

In some cases, the memory array determines a worst case timing associated with accessing a memory cell within the memory array. For instance, memory array may determine a delay for accessing each memory cell in the memory array and may identify the longest delay of the determined delays. Determining the worst case delay may include determining the threshold voltage of a selection component and determining a requisite duration for applying a voltage to a word line until the selection component reaches the threshold voltage, in addition to determining a turn on time of the selection component. The memory array may then configure the voltage source to apply a voltage for a duration that at least as long as the worst case delay. For example, the memory array may determine that the worst case delay corresponds to accessing memory cell 105-e and is 80 ns—e.g., where first delay 665 is 30 ns and that second delay 670 is 50 ns—and may apply a voltage to word line for at least 80 ns. In this way, the memory array may ensure that the applied voltage is sufficient to reliably operate all of the memory cells in the memory array. In some cases, the voltage source may continue to apply the voltage after the end of the worst case delay period to ensure that the voltage across the memory cell is applied for a desired duration (e.g., >1 ns).

In other cases, the memory array or another component may detect when a selection component is activated. For instance, the memory array may apply a voltage and look for a voltage or current glitch (e.g., a rapid increase or decrease, a distinct change) on a word line that is indicative of a selection component being activated. After detecting the glitch, the memory array may cease or alter applying the voltage. In one example, memory array applies a programming signal associated with programming a programmable resistance of a memory cell to a particular data state cell and detects a change in resistance of the memory cell to determine when a data state of the memory cell changes form the initial data state to a different data state during the application of the programming signal.

In some examples, the memory array may configure the voltage source to apply different magnitudes of voltages when accessing different memory cells. Applying voltages with higher magnitudes may decrease the delay between a time when a voltage is applied to a word line and a time when a voltage across a selection component reaches a respective threshold voltage. In some examples, the memory array may apply higher magnitude voltages when accessing memory cells located near the center of array than when accessing memory cells located near an edge of the array. In this way, the memory array may closer align when a voltage at each cell bottom rises during the applied voltage, as represented by the double-headed arrows overlaid on CB_1 635, CB_2 640, and CB_3 645. For example, by applying a higher voltage when accessing third memory cell 105-e, first delay 665 may be decreased and CB_3 645 may occur earlier in time.

The memory array may also select the magnitude of the applied voltage based on an estimated voltage drop across a word line and selection component, and an operating voltage of a memory cell. In some cases, the memory array may select the magnitude of the applied voltage based on a timing for a memory operation. For example, the memory array may select a higher magnitude to enable quicker memory operations.

Additionally or alternatively, the selection components throughout memory array may be designed with different threshold voltages. Reducing the threshold voltage of a selection component, will also decrease the delay between applying a voltage and a voltage of a selection component reaching the threshold voltage. In some examples, selection components near the center of array may have lower threshold values relative to selection components on an edge of the memory array. In this way, the memory array may closer align when a voltage at each cell bottom rises during the applied voltage. For example, third selection component 540 may be designed with a lower threshold voltage than first selection component 510. Thus, first delay 665 may be decreased and CB_3 645 may occur earlier in time. Conversely, by increasing the threshold voltage of first selection component 510, CB_1 635 may occur later in time. The memory array may similarly design the selection component with different turn-on delays to closer align when a voltage at each cell bottom rises during the applied voltage.

Figure 7:
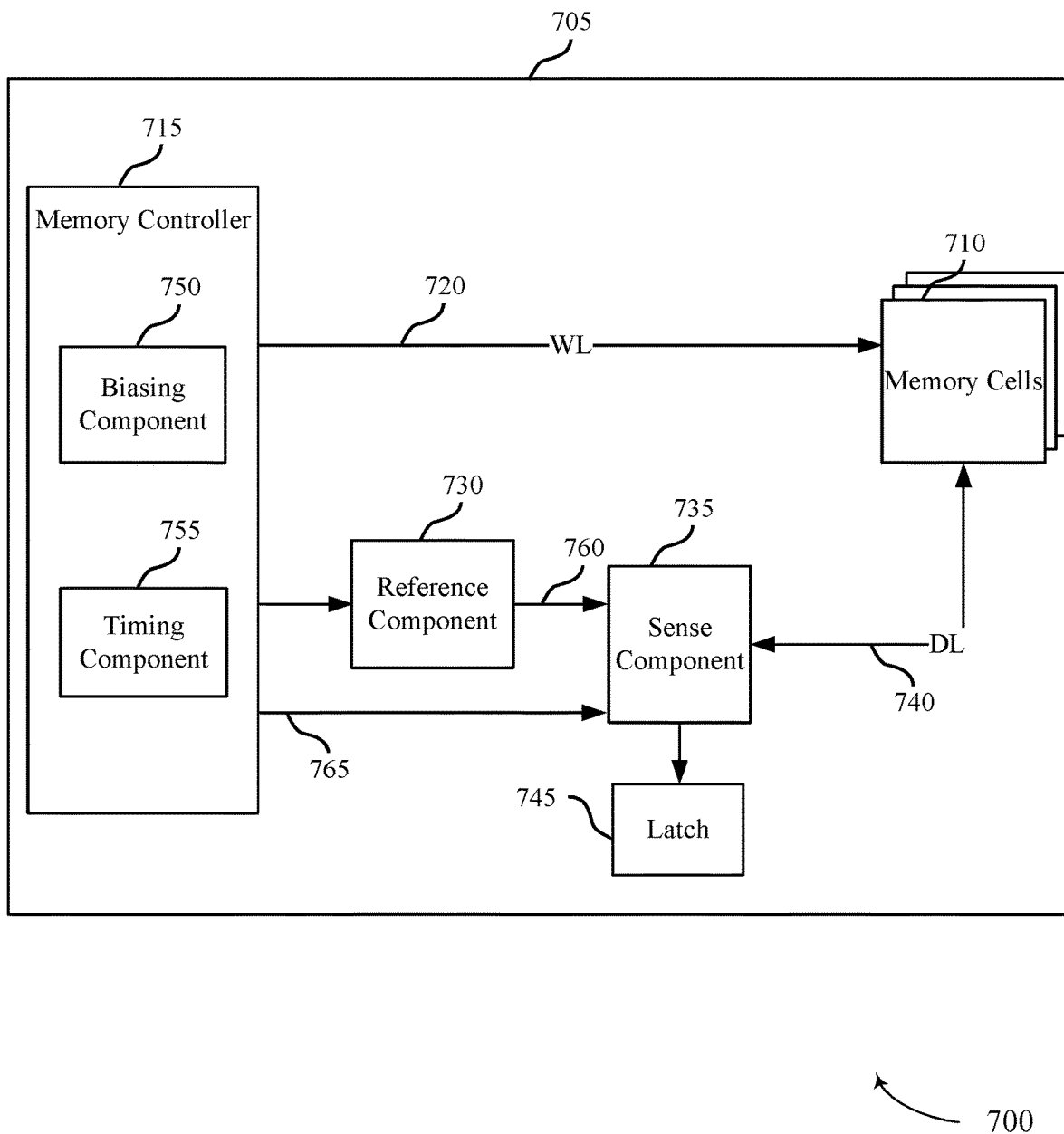
FIG. 7 illustrates a block diagram of an example memory array that supports fast pulse operation in accordance with various aspects of the present disclosure.

FIG. 7 illustrates a block diagram 700 of an example memory array 705 that supports fast pulse operation in accordance with various aspects of the present disclosure. Memory array 705 may be referred to as an electronic memory apparatus, and may be an example of a component of a memory array 100 as described with reference to FIG. 1.

Memory array 705 may include one or more memory cells 710, a memory controller 715, a word line 720, a reference component 730, a sense component 735, a digit line 740, and a latch 745. These components may be in electronic communication with each other and may perform one or more of the functions described herein. In some cases, memory controller 715 may include biasing component 750 and timing component 755. In some cases, digit line 740 may be referred to as a column line and word line 720 may be referred to as a row line.

Memory controller 715 may be in electronic communication with word line 720, digit line 740, and sense component 735, which may be examples of word line 110, digit line 115, and sense component 125 described with reference to FIGS. 1 and 2. Memory array 705 may also include reference component 730 and latch 745. The components of memory array 705 may be in electronic communication with each other and may perform some or all of the functions described with reference to FIGS. 1 through 5. In some cases, reference component 730, sense component 735, and latch 745 may be components of memory controller 715.

In some examples, digit line 740 is in electronic communication with sense component 735 and memory cells 710. A memory cell 710 may include MTJ materials and may be writable with a desired logic state (e.g., a first or second logic state) by programming a resistance of the MTJ materials. Word line 720 may be in electronic communication with memory controller 715 and a selection component of memory cell 710. Sense component 735 may be in electronic communication with memory controller 715, digit line 740, latch 745, and reference line 760. Reference component 730 may be in electronic communication with memory controller 715 and reference line 760. Sense control line 765 may be in electronic communication with sense component 735 and memory controller 715. These components may also be in electronic communication with other components, both inside and outside of memory array 705, in addition to components not listed above, via other components, connections, or busses.

Memory controller 715 may be configured to activate word line 720 or digit line 740 by applying voltages to those various nodes. For example, biasing component 750 may be configured to apply a voltage to access memory cell 710 as described above. In some cases, memory controller 715 may include a row decoder, column decoder, or both, as described with reference to FIG. 1. This may enable memory controller 715 to access one or more memory cells 710. Biasing component 750 may also provide voltage to reference component 730 in order to generate a reference signal for sense component 735.

Additionally, biasing component 750 may provide voltage for the operation of sense component 735.

In some cases, memory controller 715 may perform its operations using timing component 755. For example, timing component 755 may control the timing of the various word line or digit line selections, including timing for switching and voltage application to perform the memory functions, such as reading and writing, discussed herein. In some cases, timing component 755 may control the operations of biasing component 750.

Reference component 730 may include various components to generate a reference signal for sense component 735. Reference component 730 may include circuitry configured to produce a reference signal. In some cases, reference component 730 may be implemented using other memory cells 710. Sense component 735 may compare a signal from memory cell 710 (through digit line 740) with a reference signal from reference component 730. Upon determining the logic state, the sense component may then store the output in latch 745, where it may be used in accordance with the operations of an electronic device that memory array 705 is a part. Sense component 735 may include a sense amplifier in electronic communication with the latch and digit line 740.

Memory controller 715 may be an example of the memory controller 815 described with reference to FIG. 8. Memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 715 and/or at least some of its various sub-components may be physically located at various positions, including being distributed such that portions of functions are implemented at different physical locations by one or more physical devices. In some examples, memory controller 715 and/or at least some of its various sub-components may be a separate and distinct component in accordance with various embodiments of the present disclosure. In other examples, memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

In some examples, memory controller 715 may determine a requisite duration for applying a first voltage to word line 720, where the requisite duration corresponds to a time period during which a voltage across a selection component is configured to release electric charge. In some cases, memory controller 715 determines the requisite duration based on a worst case timing delay for accessing a memory cell within memory array 705. Memory controller 715 may also trigger biasing component 750, in combination with timing component 755, to apply the first voltage to word line 720 for at least the requisite duration. Applying the first voltage to word line 720 may cause the selection component to store electric charge and the voltage across the selection component to rise. After the voltage has been applied for the requisite duration, the voltage across the selection component may reach the threshold voltage and may transfer the stored electric charge to the memory cell. In some cases, an additional turn-on delay period between reaching the threshold voltage and transferring the stored electric charge is observed.

Figure 8:
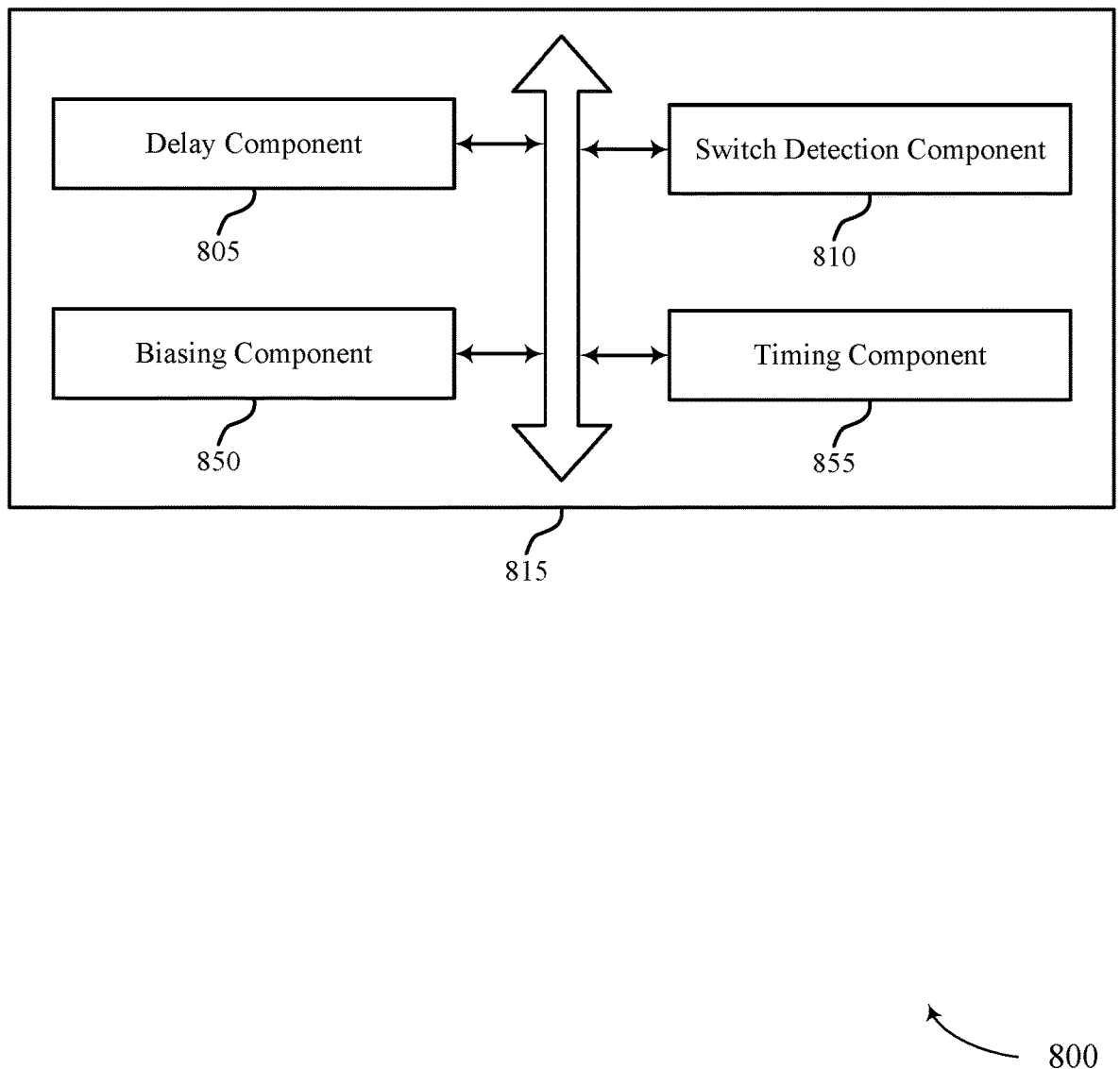
FIG. 8 illustrates a block diagram of a memory controller that supports fast pulse operation in accordance with various aspects of the present disclosure.

FIG. 8 illustrates a block diagram 800 of memory controller 815 that supports fast pulse operation in accordance with various aspects of the present disclosure. Memory controller 815 may be used to operate aspects of a memory array and may be an example of a memory controller 815 described with reference to FIGS. 5, 6, and 7. Memory controller 815 may include biasing component 850 and timing component 855, which may be respective examples of a biasing component 750 and a timing component 755 of FIG. 7. Memory controller 815 may also include delay component 805 and switch detection component 810. Each of these modules may communicate, directly or indirectly, with one another (e.g., via one or more buses).

Delay component 805 may determine a requisite duration for a first voltage to be applied to an access line before a selection component in-line with the access line reaches a threshold voltage of the selection component. A length of the requisite duration may be determined based on a magnitude of the first voltage or the threshold voltage of the selection component, or both. In determining the requisite duration, delay component 805 may identify a threshold voltage for the selection component, where the threshold voltage corresponds to a voltage at which the selection component is configured to release electric charge.

In some cases, delay component 805 may determine, for each selection component in the memory array, requisite duration for a first voltage to be applied to an access line for a selection component to reach a respective threshold value. Delay component 805 may identify the longest requisite duration of the determined requisite durations and may direct biasing component 850 to apply the first voltage for at least the longest requisite duration. In some examples, delay component 805 may identify an average requisite duration of the determined requisite durations and may direct biasing component 850 to apply the first voltage for at least the average requisite duration. In some cases, memory controller 815 may employ error correction techniques when the first voltage is applied for the average requisite duration.

In some cases, there is an additional delay (e.g., a selection component turn-on delay) between a time when the voltage of the selection component reaches the threshold voltage and the time when the selection component transfers the stored electric charge. In some cases, delay component 805 may determine an additional duration based on the delay period and/or a desired pulse duration, and biasing component 850 may be configured to apply the first voltage for the requisite duration and the additional duration.

Biasing component 850, in combination with timing component 855, may apply the first voltage to the access line for at least the requisite duration. During the requisite duration, the selection component may store electric charge. After the voltage has been applied for the requisite duration, the selection component may be activated and transfer the stored electric to a memory cell. In some examples, biasing component 850, in combination with timing component 855, may apply the first voltage to the access line for at least the requisite duration plus the turn-on delay period of the selection component.

Biasing component 850 may select a magnitude of the first voltage based on an operating voltage of the memory cell, a voltage drop of the access line, a voltage drop of the selection component, or a timing for a memory operation, or any combination thereof. In some examples, biasing component selects a magnitude of the first voltage to be larger when accessing memory cells are located near the center of the memory array.

Switch detection component 810 may detect when a resistive state of a memory cell changes. In some cases, switch detection component 810 may also detect when a selection component has been activated. In some cases, biasing component 850 may adjust application of the first voltage to the access line after determining that the selection component has transferred the stored electric charge.

Figure 9:
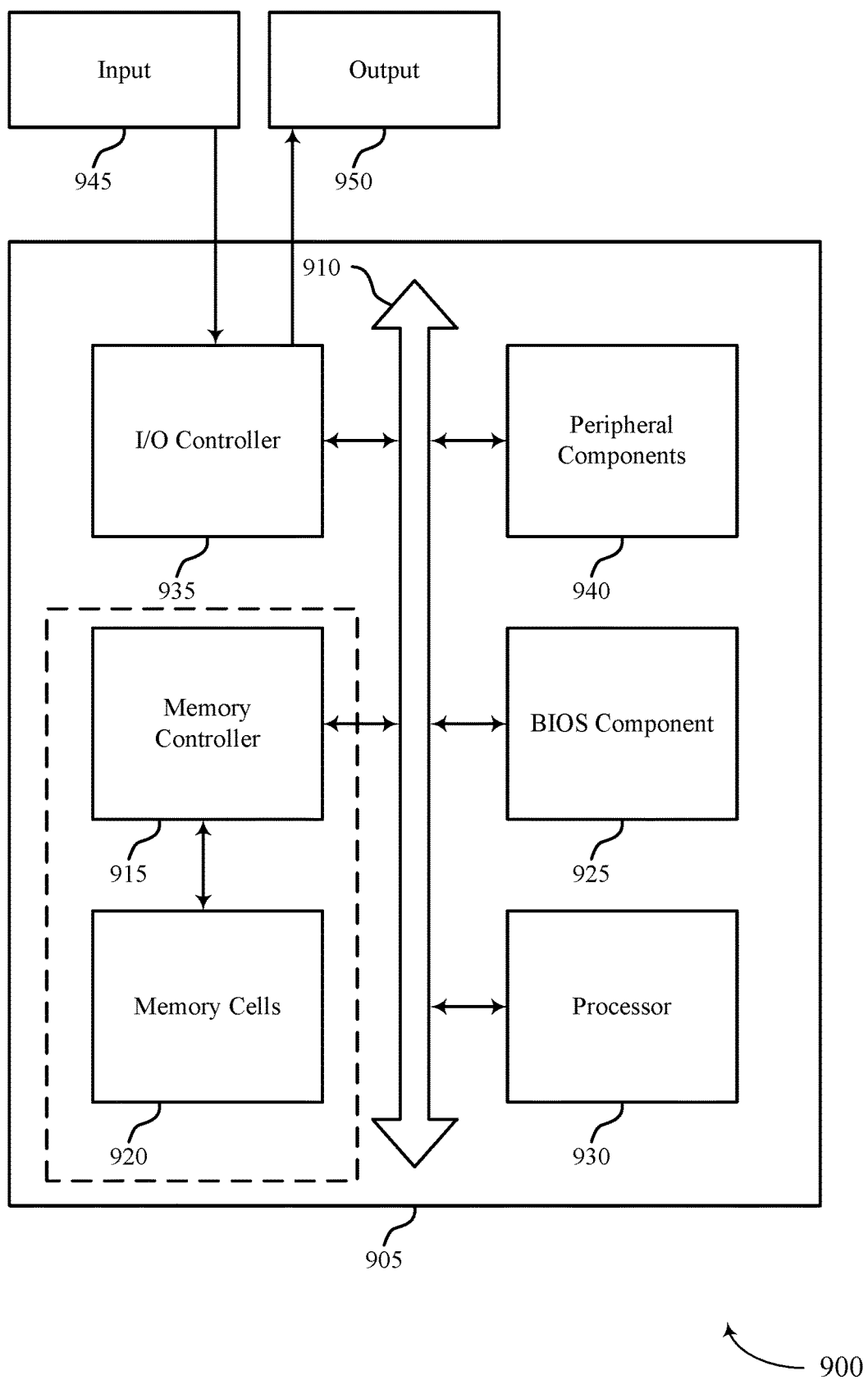
FIG. 9 illustrates a diagram of a system including a device that supports fast pulse operation in accordance with various aspects of the present disclosure.

FIG. 9 illustrates a diagram of a system 900 including a device 905 that supports fast pulse operation in accordance with various aspects of the present disclosure. Device 905 may be an example of or include the components of memory array 100 as described above, e.g., with reference to FIG. 1. Device 905 may include components for bi-directional voice and data communications including components for transmitting and receiving communications, including memory controller 915, memory cells 920, basic input/output system (BIOS) component 925, processor 930, I/O controller 935, and peripheral components 940. These components may be in electronic communication via one or more busses (e.g., bus 910).

Memory controller 915 may operate one or more memory cells as described herein. Specifically, memory controller 915 may be configured to support fast pulse operation. In some cases, memory controller 915 may include a row decoder, column decoder, or both, as described with reference to FIG. 1 (not shown).

Memory cells 920 may store information (e.g., in the form of a logical state) as described herein. BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting fast pulse operation).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or component of such a device.

Device 905 may include a means for identifying a threshold voltage of a selection component coupled with an access line and a memory cell, the threshold voltage corresponding to a voltage at which the selection component is configured to release electric charge. Examples of the means for identifying include: memory controller 715, delay component 805, or a testing component that test each selection component as discussed with reference to FIGS. 7 and 8.

Device 905 may also include a means for determining a requisite duration for a first voltage to be applied to the access line for the selection component to reach the threshold voltage. In some cases, a the means for determining determines a length of the requisite duration based at least in part on the first voltage, the threshold voltage, or both. In some case, the requisite duration is longer than a longest duration of the respective requisite durations determined for the plurality of selection components. In some cases, the requisite duration is determined based at least in part on an average of the respective requisite durations determined for the plurality of selection components. Examples of the means for determining include memory controller 715, delay component 805, and timing component 855 as discussed with reference to FIGS. 7 and 8.

Device 905 may also include a means for applying the first voltage to the access line for at least the requisite duration, wherein electric charge stored at the selection component during the requisite duration is transferred to the memory cell after the requisite duration. The means for applying the first voltage may be a further means for increasing the first voltage from a first voltage level to a second voltage level at a first rate. In some cases, a resistance of the selection component transitions from a first value to a second value when a voltage across the selection component is at least the threshold voltage. In some cases, the first voltage is applied to each of the plurality of access lines. Examples of the means for applying include biasing component 850, external source 305, and timing component 855 as discussed with reference to FIGS. 3 and 8.

Device 905 may also include a means for selecting the first voltage based at least in part on a voltage for operating the memory cell, a voltage drop of the access line, a voltage drop of the selection component, a timing for a memory operation, or any combination thereof. In some cases, the selected threshold voltage is greater than the voltage for operating the memory cell. Examples of the means for selecting include any combination of: external source 305, memory controller 715, biasing component 850, and delay component 805 as discussed with reference to FIGS. 3, 7, and 8.

Device 905 may also include a means for selecting the threshold voltage of the selection component based at least in part on a voltage for operating the memory cell. Examples of the means for selecting include any combination of: memory controller 715 and delay component 805 as discussed with reference to FIGS. 7 and 8.

Device 905 may also include a means for selecting the threshold voltage of the selection component based at least in part on a timing for a memory operation. Examples of the means for selecting include any combination of: memory controller 715 and delay component 805 as discussed with reference to FIGS. 7 and 8.

Device 905 may also include a means for writing a logic value to the memory cell by applying the first voltage to the access line, wherein the transferred electric charge switches a polarity of a free magnetic layer of MTJ materials in the memory cell to a direction corresponding to the logic value. Examples of the means for writing include any combination of: external source 305, memory controller 715, biasing component 850, and timing component 855 as discussed with reference to FIGS. 3, 7, and 8.

Device 905 may also include a means for identifying a plurality of threshold voltages for a plurality of selection components that are coupled with a plurality of memory cells and a plurality of access lines, wherein the plurality of selection components comprises the selection component. Examples of the means for identifying include any combination of: memory controller 715 and delay component 805 as discussed with reference to FIGS. 7 and 8.

Device 905 may also include a means for determining, for each selection component of the plurality of selection components, a respective requisite duration for a respective voltage to be applied to a respective access line for a respective selection component to reach a respective threshold voltage, wherein the requisite duration is based at least in part on the respective requisite durations determined for the plurality of selection components. Examples of the means for determining include any combination of: memory controller 715 and delay component 805 as discussed with reference to FIGS. 7 and 8.

Device 905 may also include a means for reading a plurality of logic states stored by the plurality of memory cells. Examples of the means for reading include any combination of: external source 305, sense component 125, reference line 330, sense line 325, reference component 730, sense component 735, memory controller 715, and biasing component 850 as discussed with reference to FIGS. 1, 3, 5, 6, 7, and 8.

Device 905 may also include a means for applying error correction techniques to the plurality of logic states based at least in part on reading the plurality of logic states. Examples of the means for applying error correction include any combination of: memory controller 715 as discussed with reference to FIG. 7 and an error correction component.

Device 905 may also include a means for determining that the selection component has transferred the electric charge. Examples of the means for determining include any combination of: memory controller 715 and switch detection component 810 as discussed with reference to FIGS. 7 and 8, in addition to a comparator.

Device 905 may also include a means for ceasing application of the first voltage to the access line based at least in part on determining that the selection component has transferred the electric charge. Examples of the means for ceasing include any combination of: external source 305, memory controller 715 and biasing component 850 as discussed with reference to FIGS. 3, 7, and 8.

Figure 10:
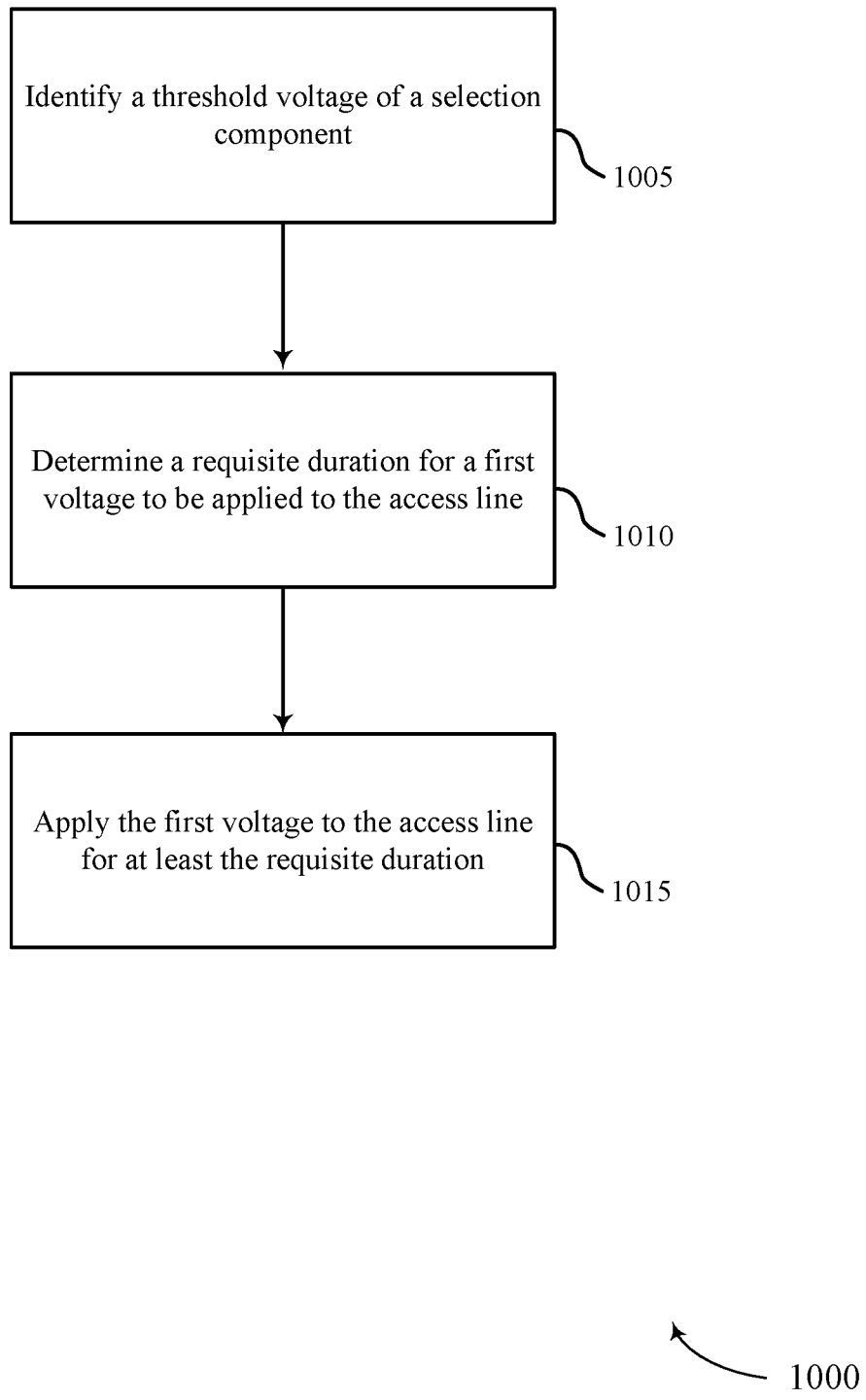
FIGS. 10-12 are flowcharts that illustrates a method or methods for fast pulse operation in accordance with various aspects of the present disclosure.

FIG. 10 is a flowchart that illustrates a method 1000 for fast pulse operation in accordance with various aspects of the present disclosure. The operations of method 1000 may be implemented by a memory array or its components as described herein. For example, the operations of method 1000 may be performed by a memory controller as described with reference to FIGS. 7 through 9. In some examples, a memory array may execute a set of codes to control the functional elements of the device to perform the functions described below. Additionally or alternatively, the memory array may perform some or all of the functions described below using special-purpose hardware.

At block 1005, the memory array may identify a threshold voltage of a selection component coupled with an access line and a memory cell, which may include an MTJ container. The threshold voltage may correspond to a voltage at which the selection component is configured to release electric charge. In some examples, a resistance of the selection component transitions from a first value to a second, lower value when a voltage across the selection component is at least the threshold voltage. The operations of block 1005 may be performed according to the methods described with reference to FIGS. 3-6. In certain examples, some or all of the operations of block 1005 may be performed by a delay component as described with reference to FIGS. 7 through 9.

In some examples, the threshold voltage of the selection component is selected based at least in part on a voltage for operating the memory cell. For instance, the threshold voltage may be selected to be greater than the voltage for operating the memory cell. Additionally or alternatively, the threshold voltage of the selection component may be based at least in part on a timing for a memory operation. For instance, the threshold voltage of the selection component may be selected to be relatively lower to support a faster memory operation.

In some cases, the memory array may identify a threshold voltage for each selection component of a plurality of selection components coupled with a plurality of access lines and a plurality of memory cells. In some examples, different selection components of the plurality of selection components may have different threshold voltages. For example, selection components near the center of the memory array may have lower threshold voltages than selection components near the edge of the memory array.

At block 1010, the memory array may determine a requisite duration for a first voltage to be applied to the access line. In some cases, the requisite duration corresponds to an amount of time needed for the selection component to reach the threshold voltage in response to a voltage being applied to the access line. The operations of block 1010 may be performed according to the methods described with reference to FIGS. 3-6. In certain examples, some or all of the operations of block 1010 may be performed by a delay component as described with reference to FIGS. 7 through 9.

In some examples, the length of the requisite duration is determined based at least in part on the first voltage (e.g., a magnitude of the first voltage) or the threshold voltage (e.g., a magnitude of the threshold voltage), or both. For instance, the length of the requisite duration may be increased if the magnitude of the first voltage is a relatively low voltage and/or the magnitude of the threshold voltage is a relatively high voltage. In some examples, the requisite duration includes an amount of time corresponding to a turn-on delay period of the selection component. And in some examples, the requisite duration includes a predetermined pulse duration for applying a desired voltage across the memory cell.

In cases where the memory array identifies a plurality of threshold voltage for a plurality of selection components, the memory array may determine, for each selection component of the plurality of selection components, a respective requisite duration. The memory array may then determine a single requisite duration based on the respective requisite durations. For instance, the memory array may select the requisite duration to be longer than a longest duration of the respective requisite durations determined for the plurality of selection components. Or the memory array may select the requisite duration to be an average of the respective requisite durations determined for the plurality of selection components.

At block 1015, the memory array may apply the first voltage to the access line for at least the requisite duration. Electric charge may be stored at the selection component during the requisite duration, and at least a portion of the stored electric charge may be transferred to the memory cell after the requisite duration. The operations of block 1015 may be performed according to the methods described with reference to FIGS. 3-6. In certain examples, some or all of the operations of block 1015 may be performed by a biasing component as described with reference to FIGS. 7 through 9. The memory array may select the first voltage based at least in part on a voltage for operating the memory cell, a voltage drop of the access line, a voltage drop of the selection component, a timing for a memory operation, or any combination thereof.

As discussed above, a magnitude of the first voltage may be selected that increases or decreases the requisite duration accordingly. The first voltage increase from a first voltage level (e.g., virtual ground) to a second voltage level (e.g., a maximum or predetermined voltage) at a first rate when applied to the access line. Accordingly, a second voltage across the selection component may increase at a second rate that is less than the first rate—e.g., due to parasitic elements of the access line. And a third voltage across the memory cell may increase at a third rate that is at least greater than the second rate—e.g., due to the selection component storing charge during the requisite duration and transferring charge to the memory cell after the requisite duration has ended.

In some cases, the memory array may apply the same first voltage to a plurality of access lines. In other cases, the memory array may apply different voltage to different access lines of the plurality of access lines. For example, the memory array may apply relatively lower voltages to memory cells near the edge of the memory array and may apply relatively higher voltage to memory cells near the center of the memory array.

In some examples, the memory array may write a logic value to the memory cell by applying the first voltage to the access line, and the released electric charge may switch a polarity of a free magnetic layer of the MTJ container to a direction corresponding to the logic value. In some examples, the memory array may read a logic value stored by the memory cell. In some cases, read a plurality of logic states stored by the plurality of memory cells. When the first voltage is applied for the average of the respective requisite duration, the memory array may apply error correction techniques to the plurality of logic states based at least in part on reading the plurality of logic states.

In some examples, the memory array may determine that the selection component has released the electric charge; for example, by detecting that a resistive state of the memory cell has changed. And the memory array may then cease application of the first voltage to the access line based at least in part on determining that the selection component has released the electric charge.

Figure 11:
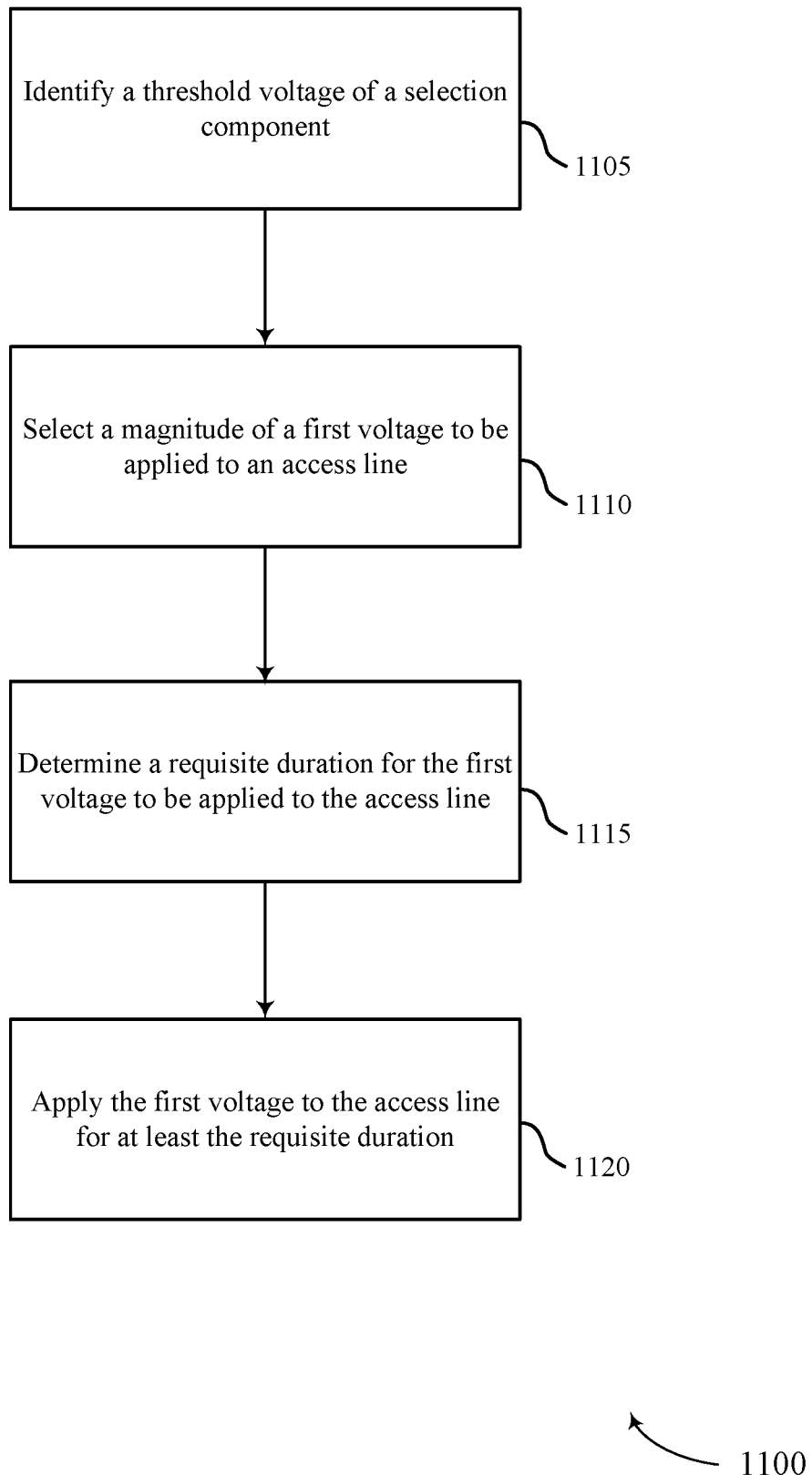

FIG. 11 is a flowchart that illustrates a method 1100 for fast pulse operation in accordance with various aspects of the present disclosure. The operations of method 1100 may be implemented by a memory array or its components as described herein. For example, the operations of method 1100 may be performed by a memory controller as described with reference to FIGS. 7 through 9. In some examples, a memory array may execute a set of codes to control the functional elements of the device to perform the functions described below. Additionally or alternatively, the memory array may perform some or all of the functions described below using special-purpose hardware.

At block 1105, the memory array may identify a threshold voltage of a selection component coupled with an access line and a memory cell, which may include an MTJ container. The threshold voltage may correspond to a voltage at which the selection component is configured to release electric charge. In some examples, a resistance of the selection component transitions from a first value to a second, lower value when a voltage across the selection component is at least the threshold voltage. The operations of block 1105 may be performed according to the methods described with reference to FIGS. 3-6. In certain examples, some or all of the operations of block 1105 may be performed by a delay component as described with reference to FIGS. 7 through 9.

At block 1110, the memory array may select a magnitude of a first voltage to be applied to an access line. The operations of block 1110 may be performed according to the methods described with reference to FIGS. 3-6. In certain examples, some or all of the operations of block 1110 may be performed by a delay component as described with reference to FIGS. 7 through 9. In some examples, the magnitude of the first voltage may be selected based on the identified threshold voltage of the selection component. In some cases, the magnitude of the first voltage may be selected based on a desired timing of a memory operation—e.g., a higher first voltage may be selected for a shorter memory operation.

At block 1115, the memory array may determine a requisite duration for a first voltage to be applied to the access line. In some cases, the requisite duration corresponds to an amount of time needed for the selection component to reach the threshold voltage in response to the first voltage being applied to the access line. The operations of block 1115 may be performed according to the methods described with reference to FIGS. 3-6. In certain examples, some or all of the operations of block 1115 may be performed by a biasing component as described with reference to FIGS. 7 through 9.

At block 1120, the memory array may apply the first voltage to the access line for at least the requisite duration. Electric charge may be stored at the selection component during the requisite duration, and at least a portion of the stored electric charge may be transferred to the memory cell after the requisite duration. The operations of block 1120 may be performed according to the methods described with reference to FIGS. 3-6. In certain examples, some or all of the operations of block 1120 may be performed by a biasing component as described with reference to FIGS. 7 through 9.

Figure 12:
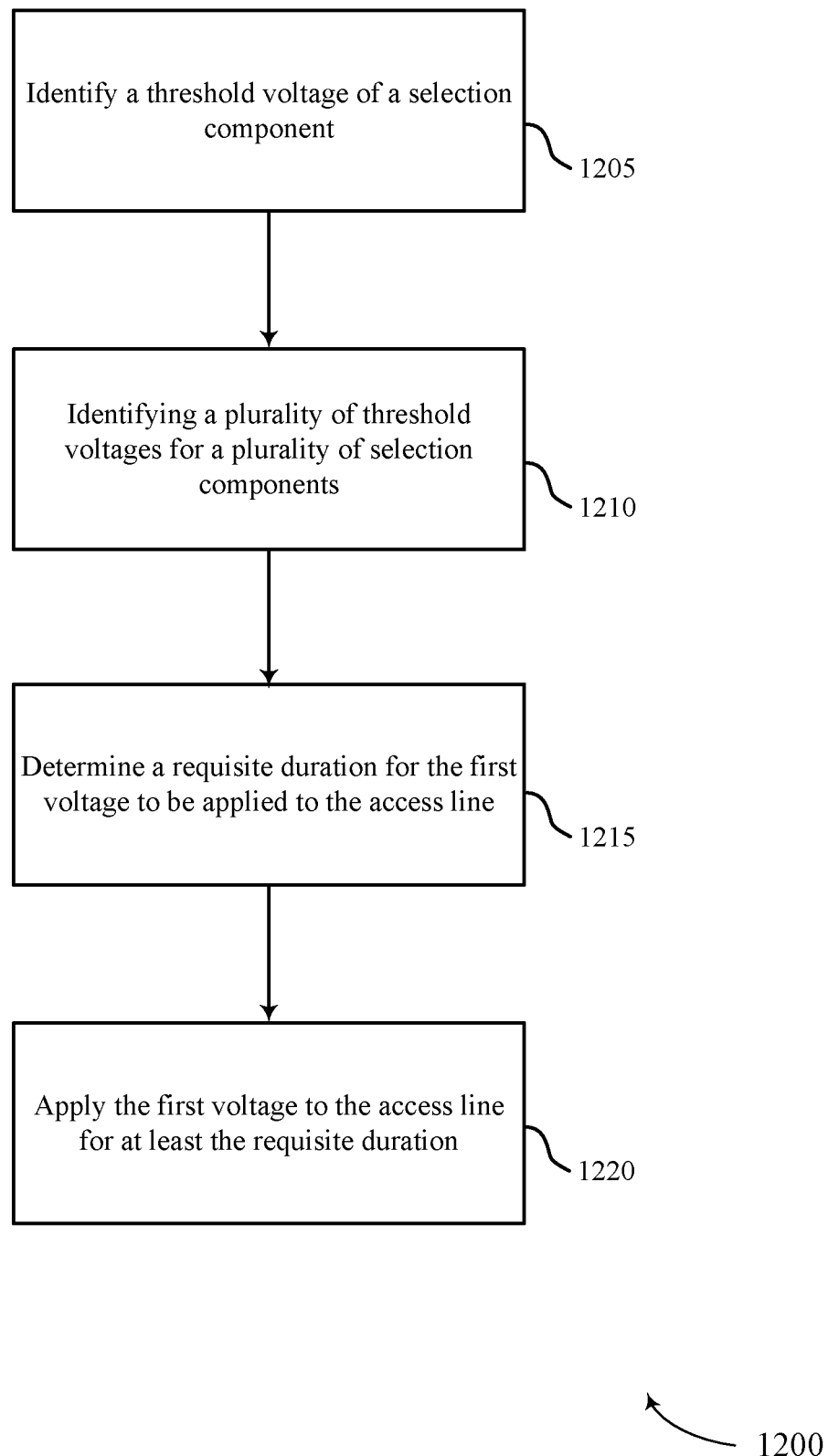

FIG. 12 is a flowchart that illustrates a method 1200 for fast pulse operation in accordance with various aspects of the present disclosure. The operations of method 1200 may be implemented by a memory array or its components as described herein. For example, the operations of method 1200 may be performed by a memory controller as described with reference to FIGS. 7 through 9. In some examples, a memory array may execute a set of codes to control the functional elements of the device to perform the functions described below. Additionally or alternatively, the memory array may perform some or all of the functions described below using special-purpose hardware.

At block 1205, the memory array may identify a threshold voltage of a selection component coupled with an access line and a memory cell, which may include an MTJ container. The threshold voltage may correspond to a voltage at which the selection component is configured to release electric charge. In some examples, a resistance of the selection component transitions from a first value to a second, lower value when a voltage across the selection component is at least the threshold voltage. The operations of block 1205 may be performed according to the methods described with reference to FIGS. 3-6. In certain examples, some or all of the operations of block 1205 may be performed by a delay component as described with reference to FIGS. 7 through 9.

At block 1210, the memory array may identify a plurality of threshold voltages for a plurality of selection components that are coupled with a plurality of memory cells and a plurality of access lines. The plurality of selection components may include the selection component. The operations of block 1210 may be performed according to the methods described with reference to FIGS. 3-6. In certain examples, some or all of the operations of block 1210 may be performed by a delay component as described with reference to FIGS. 7 through 9.

At block 1215, the memory array may determine, for each selection component of the plurality of selection components, a respective requisite duration for a respective voltage to be applied to a respective access line for a respective selection component to reach a respective threshold voltage. The operations of block 1215 may be performed according to the methods described with reference to FIGS. 3-6. In certain examples, some or all of the operations of block 1215 may be performed by a biasing component as described with reference to FIGS. 7 through 9. In some examples, the requisite duration is determined to be is longer than a longest duration of the respective requisite durations determined for the plurality of selection components. In some cases, the requisite duration is based at least in part on an average of the respective requisite durations determined for the plurality of selection components.

At block 1220, the memory array may apply the first voltage to the access line for at least the requisite duration. Electric charge may be stored at the selection component during the requisite duration, and at least a portion of the stored electric charge may be transferred to the memory cell after the requisite duration. The operations of block 1220 may be performed according to the methods described with reference to FIGS. 3-6. In certain examples, some or all of the operations of block 1220 may be performed by a biasing component as described with reference to FIGS. 7 through 9.

It should be noted that the methods described above describe possible implementations, and that the operations and the steps may be rearranged or otherwise modified and that other implementations are possible. Furthermore, embodiments from two or more of the methods may be combined.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (e.g., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these.

Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (e.g., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium.

For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

The invention claimed is:

1. A method, comprising:
identifying a first threshold voltage of a first selection component coupled with an access line and a first memory cell, the first threshold voltage corresponding to a voltage at which the first selection component is configured to release electric charge, and being greater than a voltage for writing to the first memory cell;
identifying a second threshold voltage of a second selection component coupled with the access line and a second memory cell, the second threshold voltage being different than the first threshold voltage and corresponding to a voltage at which the second selection component is configured to release electric charge;
determining a requisite duration for a first voltage to be applied to the access line for the first selection component to reach the first threshold voltage and for the second selection component to reach the second threshold voltage; and
applying the first voltage to the access line for at least the requisite duration, wherein electric charge stored at the first selection component and the second selection component during the requisite duration is transferred to the first memory cell and the second memory cell after the requisite duration.

2. The method of claim 1, further comprising:
selecting the first voltage based at least in part on a voltage for operating the first memory cell, a voltage drop of the access line, a voltage drop of the first selection component, a timing for a memory operation, or any combination thereof.

3. The method of claim 1, wherein a length of the requisite duration is determined based at least in part on the first voltage, the first threshold voltage, or both.

4. The method of claim 1, further comprising:
selecting the first threshold voltage of the first selection component based at least in part on a voltage for operating the first memory cell.

5. The method of claim 1, further comprising:
selecting the first threshold voltage of the first selection component based at least in part on a timing for a memory operation.

6. The method of claim 1, wherein the first memory cell comprises magnetic tunnel junction (MTJ) materials, the method further comprising:
writing a logic value to the first memory cell by applying the first voltage to the access line, wherein the transferred electric charge switches a polarity of a free magnetic layer of the MTJ materials to a direction corresponding to the logic value.

7. The method of claim 1, wherein applying the first voltage comprises increasing the first voltage from a first voltage level to a second voltage level at a first rate, wherein a second voltage across the first selection component increases at a second rate that is less than the first rate, and wherein a third voltage across the first memory cell increases at a third rate that is greater than the second rate.

8. The method of claim 1, wherein a resistance of the first selection component transitions from a first value to a second value when a voltage across the first selection component is at least the first threshold voltage.

9. The method of claim 1, further comprising:
identifying a plurality of threshold voltages for a plurality of selection components that are coupled with a plurality of memory cells and a plurality of access lines, wherein the plurality of selection components comprises the first selection component;
determining, for each selection component of the plurality of selection components, a respective requisite duration for a respective voltage to be applied to a respective access line for a respective selection component to reach a respective threshold voltage, wherein the requisite duration is based at least in part on the respective requisite durations determined for the plurality of selection components.

10. The method of claim 9, wherein the requisite duration is longer than a longest duration of the respective requisite durations determined for the plurality of selection components.

11. The method of claim 9, wherein the requisite duration is based at least in part on an average of the respective requisite durations determined for the plurality of selection components, the method further comprising:
reading a plurality of logic states stored by the plurality of memory cells; and
applying error correction techniques to the plurality of logic states based at least in part on reading the plurality of logic states.

12. The method of claim 9, wherein the first voltage is applied to each of the plurality of access lines.

13. The method of claim 1, further comprising:
determining that the first selection component has transferred the electric charge; and
ceasing application of the first voltage to the access line based at least in part on determining that the first selection component has transferred the electric charge.

14. An apparatus, comprising:
a first memory cell;
a second memory cell;
an access line;
a first selection component coupled with the access line and the first memory cell;
a second selection component coupled with the access line and the second memory cell; and
a controller coupled with the first memory cell, wherein the controller is operable to:
determine a requisite duration for a first voltage to be applied to the access line for the first selection component to reach a first threshold voltage and the second selection component to reach a second threshold voltage, the first threshold voltage corresponding to a voltage at which the first selection component is configured to release electric charge and the second threshold voltage corresponding to a voltage at which the second selection component is configured to release electric charge, wherein the first threshold voltage is greater than a voltage for writing to the first memory cell and different than the second threshold voltage; and
apply the first voltage to the access line for at least the requisite duration, wherein electric charge stored at the first selection component and electric charge stored at the second selection component increases during the requisite duration and is transferred to the first memory cell and the second memory cell after the requisite duration.

15. The apparatus of claim 14, wherein the controller is further operable to:
identify the first threshold voltage of the first selection component, wherein determining the requisite duration is based at least in part on identifying the first threshold voltage.

16. The apparatus of claim 14, wherein the first memory cell comprises magnetic tunnel junction (MTJ) materials, and wherein the transferred electric charge switches a polarity of a free magnetic layer of the MTJ materials based at least in part on a logic value of the first memory cell.

17. The apparatus of claim 14, wherein the controller is further operable to:
apply the first voltage to a plurality of access lines for an average duration; and
read a plurality of logic states stored by a plurality of memory cells using error correction techniques based at least in part on applying the first voltage.

18. The apparatus of claim 14, wherein the controller is further operable to:
identify the first threshold voltage and a voltage for operating the first memory cell; and
select the first voltage based at least in part on identifying the first threshold voltage and the voltage for operating the first memory cell; and
determine the requisite duration for applying the first voltage based at least in part on the selected first voltage.

19. The apparatus of claim 14, wherein the controller is further operable to:
determine that the first selection component has transferred the stored electric charge; and
adjust application of the first voltage to the access line after determining that the first selection component has transferred the stored electric charge.

20. An apparatus, comprising:
a voltage source;
an access line coupled with the voltage source;
a first memory cell coupled with the access line;
a second memory cell coupled with the access line; and
a first selection component coupled with the access line and the first memory cell; and
a second selection component coupled with the access line and the second memory cell, wherein the voltage source is configured to apply a first voltage to the access line for a requisite duration for the first selection component to reach a first threshold voltage that corresponds to a voltage at which the first selection component is configured to release electric charge and is greater than a voltage for writing to the first memory cell and for the second selection component to reach a second threshold voltage, the second threshold voltage being different than the first threshold voltage and corresponding to a voltage at which the second selection component is configured to release electric charge, and wherein the first selection component and the second selection component are configured to transfer electric charge stored at the first selection component and the second selection component after the requisite duration.

21. The apparatus of claim 20, wherein a resistance of the first selection component is a first value when a voltage across the first selection component is below the first threshold voltage, and wherein the resistance of the first selection component is a second value lower than the first value when the voltage across the first selection component is higher than the first threshold voltage.

22. The apparatus of claim 20, wherein the voltage source is located at a first distance from the first memory cell and a second distance from the second memory cell, wherein the first distance is greater than the second distance, and wherein the second memory cell is coupled with the second selection component.

23. The apparatus of claim 20, wherein the first selection component is a two-terminal device and is located in-line with the first memory cell.

24. The apparatus of claim 20, wherein the first memory cell comprises magnetic tunnel junction (MTJ) materials, and wherein the first selection component is a diode comprising copper.

25. The apparatus of claim 20, wherein the first selection component has an ON-state current density that is greater than 30 Megaamperes/cm2, an ON-state current that is greater than 10 microamperes, an OFF-state leakage current that is less than 10 nanoamperes, and switches with a rise time that is less than 1 nanosecond.

26. The apparatus of claim 20, wherein, after the first threshold voltage is reached the first selection component has a turn-on delay between 10 nanoseconds and 50 nanoseconds, and wherein a length of a second duration is equivalent to the turn-on delay of the first selection component.

27. The apparatus of claim 20, wherein the first selection component comprises an electrically non-linear component, a metal-ion based diode, an ovonic threshold switch (OTS), or a metal-conductor-metal (MSM) switch.

28. The apparatus of claim 20, wherein the first selection component comprises a metal-insulator-metal (MIM) junction that comprises: an alloy of selenium (Se), arsenic (As), and germanium (Ge), or a Cu-chalcogenide material, or any combination thereof.

29. The method of claim 1, wherein a rate of change of the first voltage is zero during a second duration.

30. The method of claim 1, wherein a length of a second duration is at least half of a length of the requisite duration.

31. The method of claim 1, further comprising:
determining a second requisite duration for the first voltage to be applied to the access line for the second selection component to reach the second threshold voltage, wherein the requisite duration is longer than the second requisite duration.

* * * * *